United States Patent
Ohba et al.

(10) Patent No.: US 8,742,489 B2
(45) Date of Patent: Jun. 3, 2014

(54) NONVOLATILE SEMICONDUCTOR MEMORY

(75) Inventors: Ryuji Ohba, Kawasaki (JP); Daisuke Matsushita, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/427,587

(22) Filed: Mar. 22, 2012

(65) Prior Publication Data

US 2012/0235223 A1 Sep. 20, 2012

Related U.S. Application Data

(63) Continuation of application No. PCT/JP2009/066697, filed on Sep. 25, 2009.

(51) Int. Cl.
*H01L 29/792* (2006.01)
*H01L 21/336* (2006.01)

(52) U.S. Cl.
USPC ............ 257/324; 438/287; 257/E21.423

(58) Field of Classification Search
CPC ............ H01L 29/792; H01L 29/66833; H01L 29/7926
USPC ............ 257/325, E29.309, 324, E21.423; 438/287

See application file for complete search history.

(56) References Cited

U.S. PATENT DOCUMENTS

| | | | |
|---|---|---|---|
| 5,714,766 A | 2/1998 | Chen et al. | |
| 5,937,295 A | 8/1999 | Chen et al. | |
| 6,548,825 B1 * | 4/2003 | Yoshii et al. | 257/24 |
| 6,680,505 B2 | 1/2004 | Ohba et al. | |
| 6,740,928 B2 | 5/2004 | Yoshii et al. | |
| 7,629,642 B2 | 12/2009 | Ohba | |
| 8,115,248 B2 | 2/2012 | Kai et al. | |
| 2002/0140023 A1 * | 10/2002 | Ohba et al. | 257/315 |
| 2004/0256653 A1 * | 12/2004 | Iwata et al. | 257/300 |
| 2006/0060915 A1 * | 3/2006 | Lojek | 257/322 |
| 2012/0061746 A1 | 3/2012 | Ohba | |

FOREIGN PATENT DOCUMENTS

| | | |
|---|---|---|
| CN | 1551362 | 12/2004 |
| JP | 09-116106 | 5/1997 |
| JP | 10-200001 | 7/1998 |
| JP | 2001-313342 | 11/2001 |

(Continued)

OTHER PUBLICATIONS

International Search Report issued Dec. 28, 2009 in PCT/JP2009/066697 filed Sep. 25, 2009.

(Continued)

*Primary Examiner* — Kevin Parendo
*Assistant Examiner* — Lamont Koo
(74) *Attorney, Agent, or Firm* — Oblon, Spivak, McClelland, Maier & Neustadt, L.L.P.

(57) ABSTRACT

According to one embodiment, a nonvolatile semiconductor memory including a first gate insulating film formed on a channel region of a semiconductor substrate, a first particle layer formed in the first gate insulating film, a charge storage part formed on the first gate insulating film, a second gate insulating film which is formed on the charge storage part, a second particle layer formed in the second gate insulating film, and a gate electrode formed on the second gate insulating film. The first particle layer includes first conductive particles that satisfy Coulomb blockade conditions. The second particle layer includes second conductive particles that satisfy Coulomb blockade conditions and differs from the first conductive particles in average particle diameter.

9 Claims, 16 Drawing Sheets

(56) References Cited

FOREIGN PATENT DOCUMENTS

| | | |
|---|---|---|
| JP | 2002-289709 | 10/2002 |
| JP | 2003-078050 | 3/2003 |
| JP | 2003-318293 | 11/2003 |
| JP | 2006-190990 | 7/2006 |
| KR | 10-2005-0070129 | 7/2005 |
| KR | 10-2006-0048477 | 5/2006 |
| WO | WO 2005/101488 | 10/2005 |
| WO | WO 2008/142739 | 11/2008 |

OTHER PUBLICATIONS

U.S. Appl. No. 13/419,930, filed Mar. 14, 2012, Ohba.
U.S. Appl. No. 13/426,842, filed Mar. 22, 2012, Ohba.
Notice of Preliminary Rejection issued May 21, 2013 in Korean Patent Application No. 10-2011-7031146 (with English translation).
Office Action mailed Jul. 9, 2013, in Japanese Patent Application No. 2011-532852 (with English Translation).
Office Action mailed Aug. 16, 2013, in Chinese Patent Application No. 200980160141.7 (with English Translation).

\* cited by examiner

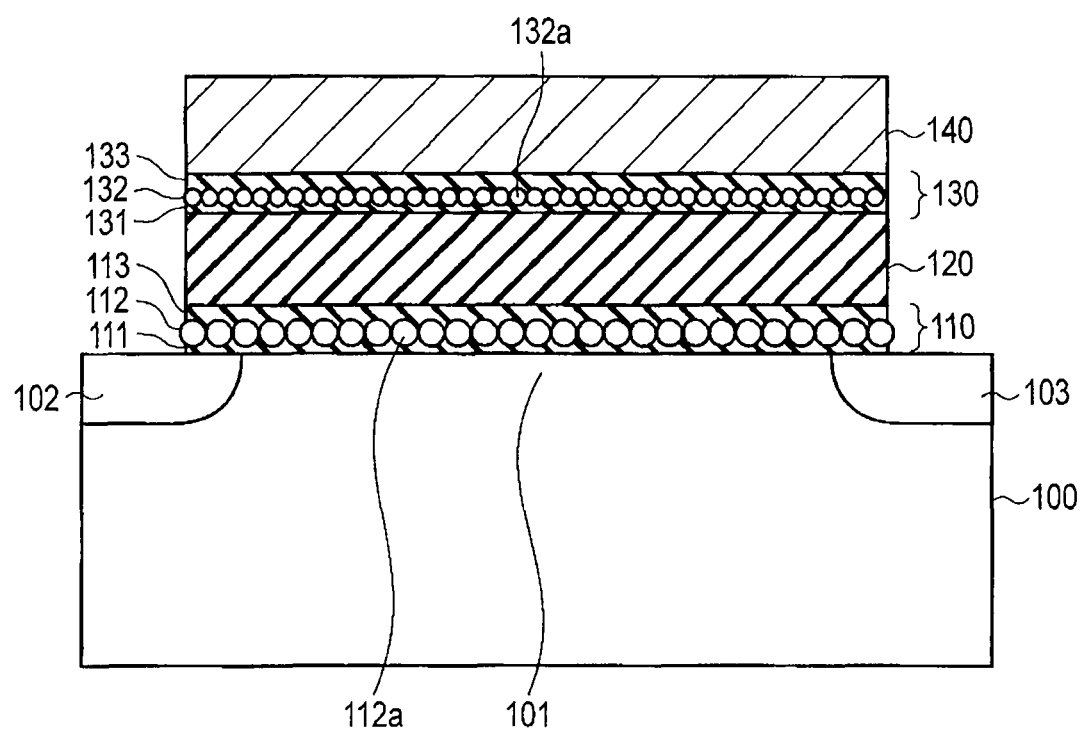
F I G. 1

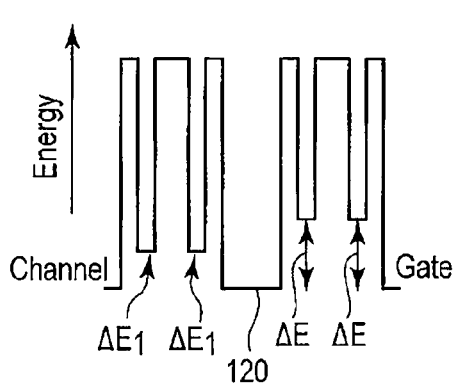
F I G. 6A
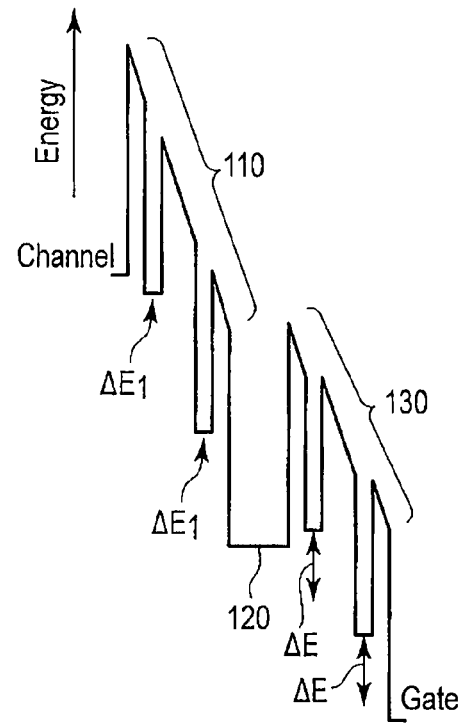
F I G. 6B
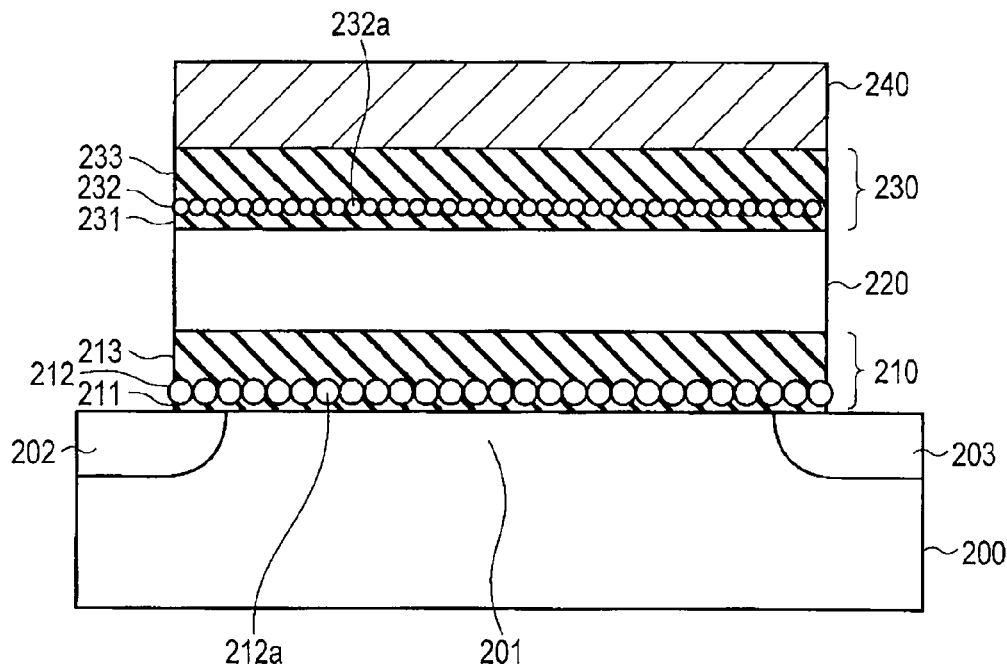
F I G. 7

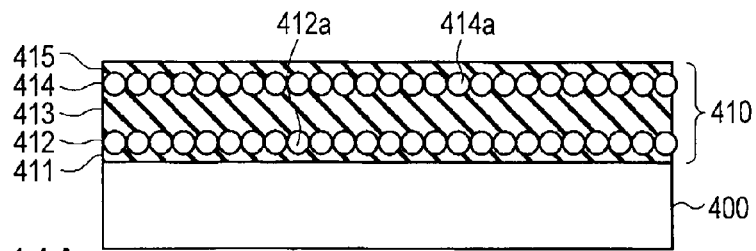
F I G. 11A
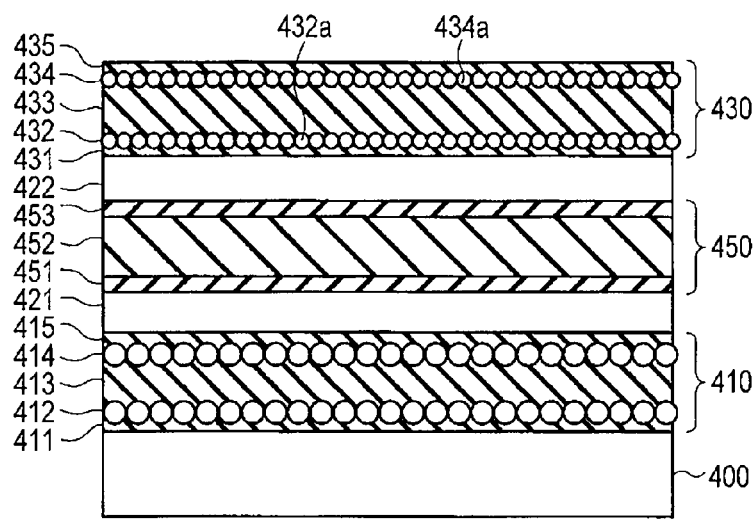
F I G. 11B
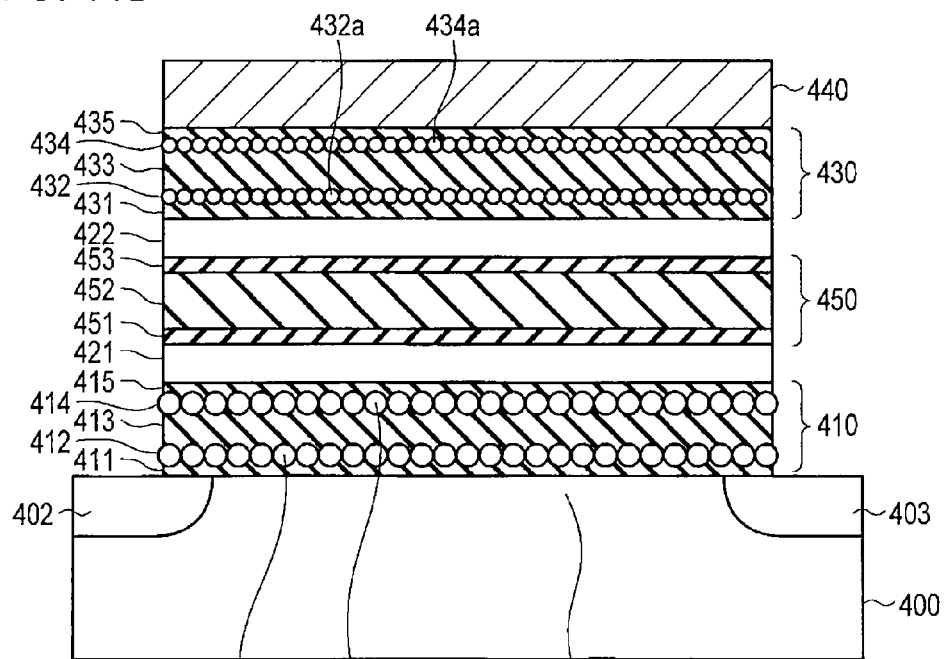
F I G. 11C

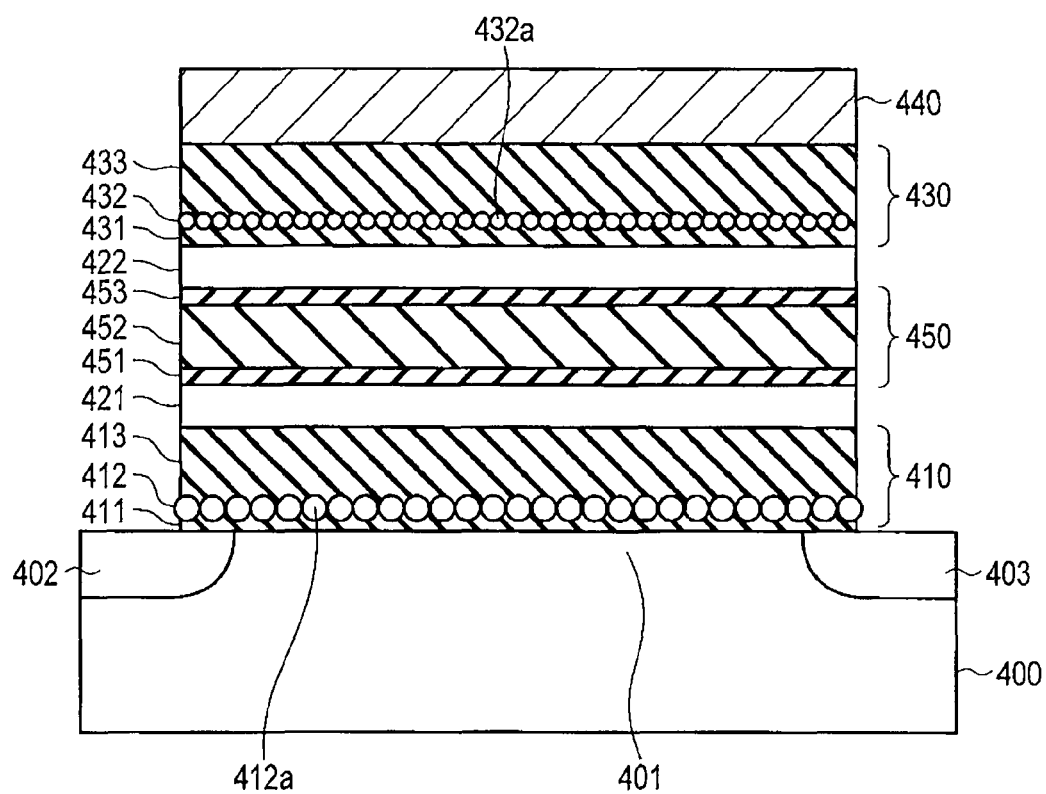
F I G. 13

NONVOLATILE SEMICONDUCTOR MEMORY

CROSS-REFERENCE TO RELATED APPLICATIONS

This application is a Continuation application of PCT Application No. PCT/JP2009/066697, filed Sep. 25, 2009, the entire contents of which are incorporated herein by reference.

FIELD

Embodiments described herein relate generally to a nonvolatile semiconductor memory with a charge storage part between a channel region of a semiconductor substrate and a gate electrode.

BACKGROUND

In recent years, a nonvolatile semiconductor memory with a structure that has a particle layer including conductive particles, such as Si nanocrystals, inserted in a tunnel oxide film has been developed as an advanced MONOS nonvolatile semiconductor memory (e.g., refer to JP-A 2003-78050 [KOKAI]). The structure of this memory is such that charges can go in and out in the form of tunnel current between the Si surface and the trap level in the Si nitride film (charge storage layer) via a double tunnel junction that has Si nanocrystals meeting Coulomb blockade conditions sandwiched between tunnel oxide films.

In retaining memory, the tunnel of information charge is blocked by an energy barrier ΔE caused by quantum confinement and the Coulomb blockade effect of Si nanocrystals. Therefore, the memory retention characteristic can be improved exponentially according to $\exp(\Delta E/k_B T)$. In a write/erase operation, a suitable write/erase voltage is applied, allowing information electrons to tunnel through without being affected by the energy barrier ΔE. Consequently, high-speed write/erase operation can be performed.

To miniaturize this type of semiconductor memory, it is necessary to make each layer thinner. However, it is necessary to make a block insulating film sufficiently thick to prevent stored charges in the charge storage layer from being discharged to the gate electrode, causing the problem of making more difficult the thinning of a block insulating film than a tunnel insulating film. In addition, use of a multilevel configuration is effective in increasing capacity. However, a memory using particles has the problem of being difficult to realize a multilevel configuration.

A nonvolatile semiconductor memory which causes particles themselves to store charges has been proposed (e.g., refer to JP-A 2003-318293 [KOKAI]). However, this type of semiconductor memory requires the particle diameter and variance of particles to be precisely controlled to cause particles themselves to store charges, which causes the problem of low reliability.

BRIEF DESCRIPTION OF THE DRAWINGS

FIG. 1 is a sectional view showing an element structure of a nonvolatile semiconductor memory according to a first embodiment;

FIGS. 6A and 6B show energy bands in the nonvolatile semiconductor memory of the second embodiment;

FIG. 7 is a sectional view showing an element structure according to a modification of the second embodiment;

FIGS. 11A to 11C are sectional views to explain the process of manufacturing a nonvolatile semiconductor memory according to a fourth embodiment;

FIG. 13 is a sectional view showing an element structure according to a modification of the fourth embodiment;

DETAILED DESCRIPTION

Figure 2A:
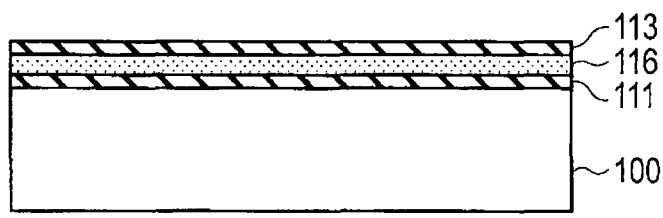
FIGS. 2A to 2E are sectional views to explain the process of manufacturing a nonvolatile semiconductor memory according to the first embodiment.

In general, according to one embodiment, a nonvolatile semiconductor memory comprising: a first gate insulating film which is formed on a channel region of a semiconductor substrate, a first particle layer which is formed in the first gate insulating film, a charge storage part which is formed on the first gate insulating film, a second gate insulating film which is formed on the charge storage part, a second particle layer which is formed in the second gate insulating film, and a gate electrode which is formed on the second gate insulating film. The first particle layer includes first conductive particles that satisfy Coulomb blockade conditions. The second particle layer includes second conductive particles that satisfy Coulomb blockade conditions and differs from the first conductive particles in average particle diameter.

Hereinafter, embodiments will be explained in detail with reference to the accompanying drawings.

First Embodiment

FIG. 1 is a sectional view showing an element structure of a nonvolatile semiconductor memory (a MONOS memory with the particle diameter differing between the upper part and lower part of the charge storage part) according to a first embodiment. Although the configuration of one memory will be shown below, a plurality of units of this memory are arranged so as to be combined with switching elements and others, thereby configuring a semiconductor memory device.

At the surface of a p-type Si substrate 100, a source region 102 and a drain region 103 of n-type impurities are formed so as to sandwich a channel region 101 between them. On the channel region 101 of the substrate 100, a tunnel insulating film (a first gate insulating film) 110 is formed. The tunnel insulating film 110 is composed of a 1-nm-thick thermally oxidized film ($SiO_2$) 111, an Si nanocrystal layer (a first particle layer) 112, and a 1-nm-thick thermally oxidized film 113. That is, an Si nanocrystal layer 112 composed of Si nanocrystals (first conductive particles) 112a with a diameter of about 1.5 nm above the surface of the substrate 110 via the thermally oxidized film 111. On the Si nanocrystal layer 112, a thermally oxidized film 113 is formed, thereby forming a tunnel insulating film 110. The Si nanocrystals 112a are submicroscopic crystals that satisfy the Coulomb blockade conditions (that the charging energy of an electron is higher than heat fluctuation).

On the tunnel insulating film 110, a 5-nm-thick charge storage layer 120 composed of an Si nitride film is formed. On the charge storage layer 120, a block insulating film (a second gate insulating film) 130 is formed. The block insulating film 130 is configured by forming an Si nanocrystal layer (a second particle layer) 132 composed of Si nanocrystals (second conductive particles) 132a with a diameter of about 1 nm via a 1-nm-thick thermally oxidized film 131 on the charge storage layer 120 and then forming a 1-nm-thick thermally oxidized film 133 on the Si nanocrystal layer 132.

On the block insulating film 130, a gate electrode 140 composed of a 200-nm-thick $n^+$ polysilicon film is formed. This configuration realizes a nonvolatile semiconductor memory which enables an improvement in memory retention while assuring low-voltage, high-speed writing and is helpful in miniaturization.

Next, a method of manufacturing a nonvolatile semiconductor memory of the first embodiment will be explained with reference to FIGS. 2A to 2E.

First, as shown in FIG. 2A, a thermally oxidized film 111 with a thickness of Tox=1 nm is formed on the Si substrate 100. On the thermally oxidized film 111, an amorphous silicon (a-Si) layer 116 is deposited to a thickness of 2 nm by means of a CVD apparatus. Then, on the surface of the a-Si layer 116, a 1-nm-thick oxide film 113 is formed by thermal oxidation. As a result, the thickness of the a-Si layer 116 becomes 1.5 nm and is sandwiched between the 1-nm-thick oxide films 111, 113 vertically.

Figure 2B:
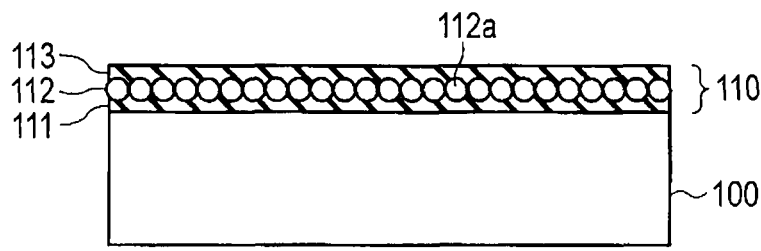

Next, when high-temperature annealing is done at 950° C. in an atmosphere of nitrogen, the a-Si layer 116 changes into a large number of Si nanocrystals (first conductive particles) 112a of about the same size as the thickness of the a-Si layer as shown in FIG. 2B. Then, an Si nanocrystal layer 112 composed of an Si nanocrystal group is formed. As a result, the Si nanocrystal layer 112 is sandwiched between the oxide films 111, 113, producing a tunnel insulating film (a first gate insulating film) 110.

Figure 2C:
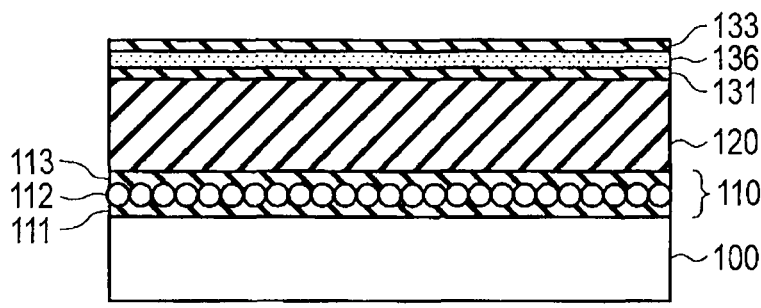

Next, as shown in FIG. 2C, on the tunnel insulating film 110, a charge storage layer 120 composed of a 5-nm-thick Si nitride film is formed by LPCVD techniques. Then, on the charge storage layer 120, a 1-nm-thick oxide film 131 of $SiO_2$ or the like is formed by LPCVD techniques. On the oxide film 131, an a-Si layer 136 is deposited to a thickness of 1.5 nm by means of the CVD apparatus. In addition, by thermal oxidation, a 1-nm-thick oxide film 133 is formed on the surface to the a-Si layer 136. As a result, the thickness of a-Si layer 136 becomes 1 nm and is sandwiched between the 1-nm-thick oxide films 131, 133 vertically. The oxide films are not necessarily limited to $SiO_2$ and may contain traces of nitrogen.

Figure 2D:
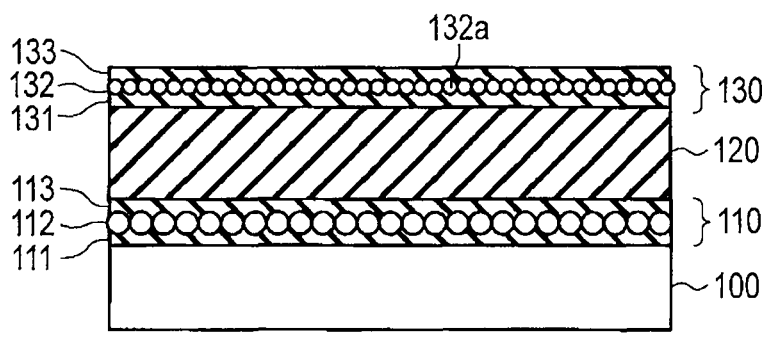

Next, when high-temperature annealing is done at 950° in an atmosphere of nitrogen, the a-Si layer 136 changes into a large number of Si nanocrystals (second conductive particles) 132a of about the same size as the thickness of the a-Si layer as shown in FIG. 2D. Therefore, an Si nanocrystal layer (a second particle layer) 132 composed of an Si nanocrystal group is formed. As a result, the Si nanocrystal layer 132 is sandwiched between the oxide films 131, 133, producing a block insulating film 130.

After crystals about the same size as the thickness of the a-Si film have been formed, lateral crystal growth is less liable to take place in a thin film thickness because of the tendency to maintain the crystal state where the surface energy is the lowest. Therefore, adjusting the nitrogen annealing conditions enables the particle diameters of the Si nanocrystals 112a, 132a whose typical sizes are about the film thickness to be controlled. Since the typical sizes are determined by the film thickness, the typical size of the lower Si nanocrystals 112a is 1.5 nm and that of the upper Si nanocrystals 132a is 1 nm.

Figure 2E:
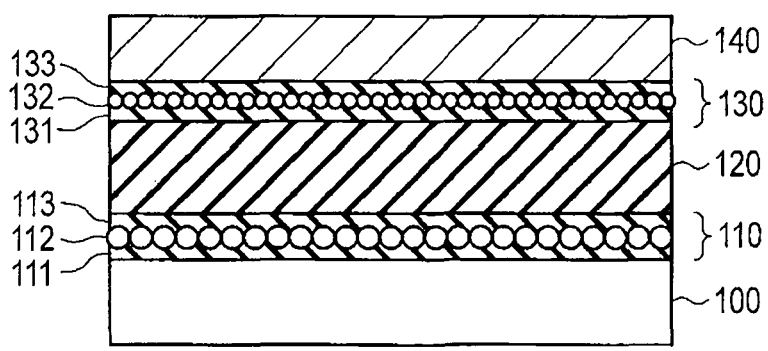

Next, as shown in FIG. 2E, on the block insulating film 130, a 200-nm-thick $n^+$ polysilicon layer to serve as a gate electrode 140 is deposited by CVD techniques. Then, with a resist pattern (not shown) as a mask, each layer is selectively etched, forming a gate electrode part. Thereafter, phosphorus is implanted at a dose of $1\times10^{15}$ cm$^{-2}$ at an incident energy of 5 keV and is then subjected to rapid annealing at 1000° C. for 10 seconds, thereby forming an $n^+$ diffused layer to function as the source/drain regions 102, 103. As a result, a structure shown in FIG. 1 is obtained.

Figure 3A:
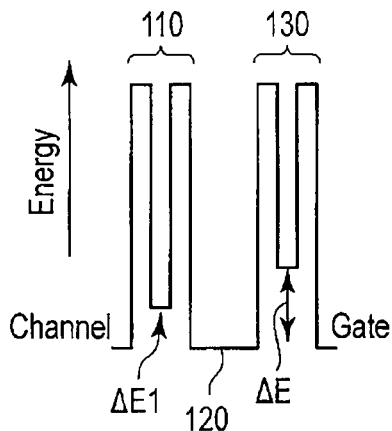
FIGS. 3A and 3B show energy bands in the nonvolatile semiconductor memory of the first embodiment.

Next, the reason why the memory with the structure of the first embodiment is helpful in miniaturization will be explained with reference to energy band diagrams in FIGS. 3A and 3B. FIG. 3A shows a memory retention state and FIG. 3B shows a write voltage applied state.

The smaller the particle diameter of the silicon nanocrystal, the higher the energy barrier ΔE in a silicon nanocrystal. Therefore, as shown in FIG. 3A, $\Delta E_1$ of the lower Si nanocrystals 112a is lower than ΔE of the upper Si nanocrystals 132a.

Figure 3B:
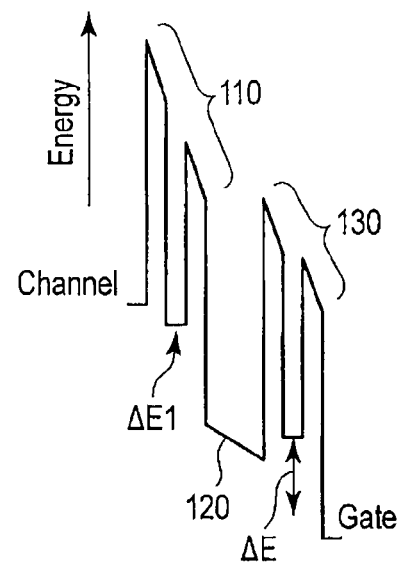

When writing is done, a suitable write voltage is applied to inject electrons from the channel into an electron trap of the charge storage layer 120 as shown in FIG. 3B, causing electrons to go over $\Delta E_1$ of the lower Si nanocrystals 112a, which enables high-speed writing. On the other hand, information electrons in the charge storage layer 120 cannot go over the upper Si nanocrystals 132a because of the existence of an energy barrier resulting from ΔE being higher than $\Delta E_1$. Therefore, the Si nanocrystal layer 132 functions as a block layer.

Although in FIGS. 3A and 3B, an electron trap in the silicon nitride film (120) acting as a charge storage part is shown so as to have the same energy as the conduction band edge of silicon when viewed from the vacuum level, the trap is actually distributed around the conduction band edge. Even in that case, many electron trap levels have energy close to or lower than the conduction band edge. The fact remains that a smaller particle diameter produces a higher energy barrier than a larger particle diameter. Therefore, the smaller-particle-diameter Si nanocrystal side still can be used as a block layer.

Similarly, in erasing, the same voltage is applied in a direction opposite to that in the writing, which enables erasing to be done with the larger-particle-diameter side used as a tunnel layer and the smaller-particle-diameter side used as a block layer. In retaining data, memory can be retained for a long time according to $\exp(\Delta E/k_B T)$ from a statistical-mechanical viewpoint since energy barriers $\Delta E1$, $\Delta E$ produced by the Si nanocrystal layers 112, 132 exist on both sides. Therefore, in the first embodiment, not only the tunnel insulating film 110 but also block insulating film 130 can be thinned remarkably, producing a structure favorable for the miniaturization of memory elements.

While in the first embodiment, the particle diameter of the Si nanocrystals 112a on the channel side are made larger than that of the Si nanocrystals 132a on the gate side, the particle diameter on the channel side may be made smaller than that on the gate side. In this case, the information charge injection/ejection between the gate and the charge storage part can be reversed vertically to produce a block layer between the channel and the charge storage layer, which produces a memory structure favorable for miniaturization in a similar way.

In addition, while in the first embodiment, the oxide films 111, 113, 131, 133 all have a film thickness of 1 nm, if at least one of the oxide films sandwiching each Si nanocrystal layer between them vertically is as thin as about 1 nm, the other may be thicker.

Figure 4:
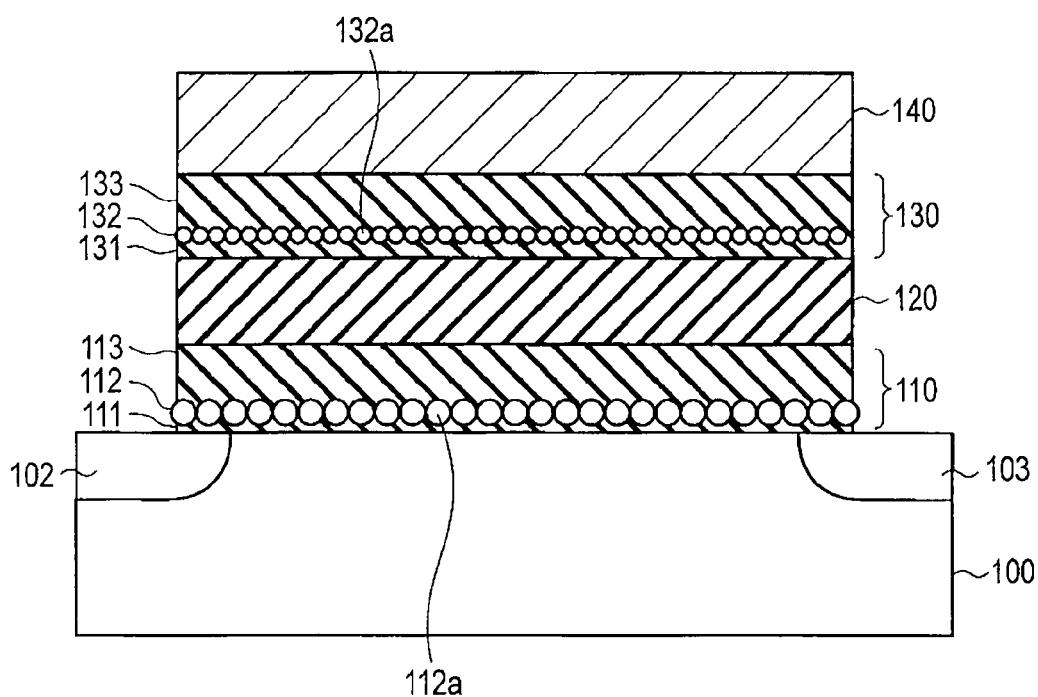
FIG. 4 is a sectional view showing an element structure according to a modification of the first embodiment.

FIG. 4 shows an example of the oxide films 113 and 133 being as thick as 4 nm. Such a thick oxide film can be formed by increasing the thickness of an oxide film by, for example, LPCVD techniques. In a case as shown in FIG. 4, $\Delta E_1$ of the lower Si nanocrystals 112a is exceeded by applying a suitable write voltage at the time of writing, which enables high-speed writing. On the other hand, information electrons in the charge storage part cannot go over the upper Si nanocrystals 132a because of the existence of an energy barrier resulting from $\Delta E$ being higher than $\Delta E_1$. Therefore, in this case, too, the Si nanocrystal layer 132 functions as a block layer.

In erasing, when attention is focused on holes on the valence band side, the facts that an energy barrier to holes is formed in an Si nanocrystal and that an energy barrier is higher as the particle diameter is smaller are the same as in the above example. Therefore, applying a suitable erase voltage causes holes to go over $\Delta E_1^{hole}$ of the lower Si nanocrystals 112a, which enables erasing. On the other hand, holes in the charge storage part cannot go over the upper Si nanocrystals 132a because of the existence of an energy barrier resulting from $\Delta E^{hole}$ being higher than $\Delta E_1^{hole}$. Therefore, the Si nanocrystal layer 132 functions as a block layer in erasing. Although in FIGS. 4, 111 and 131 are made thinner and 113 and 133 are made thicker, making 111 and 131 thicker and 113 and 133 thinner enables the smaller particle diameter side to function as a block layer.

As described above, the Si nanocrystals 112a, 132a are arranged below and above the charge storage layer 120, respectively, and made different in particle diameter, and at least one of the oxide films sandwiching each of the Si nanocrystal layers 112, 132 between them vertically is made as thin as about 1 nm, which produces a memory structure favorable for miniaturization with a thinned block layer.

That is, in a memory device which has a charge storage part between the channel and the gate, a conductive nanocrystal layer is provided between the channel and the charge storage part and another conductive nanocrystal layer is provided between the gate and the charge storage part. In addition, one of the particle diameter of conductive particles is made smaller microscopic to make the energy barrier higher to suppress current leakage exponentially, which enables a particle layer with a smaller particle diameter to be used as a block layer. This makes it possible to realize a memory structure favorable for miniaturization.

Second Embodiment

Figure 5A:
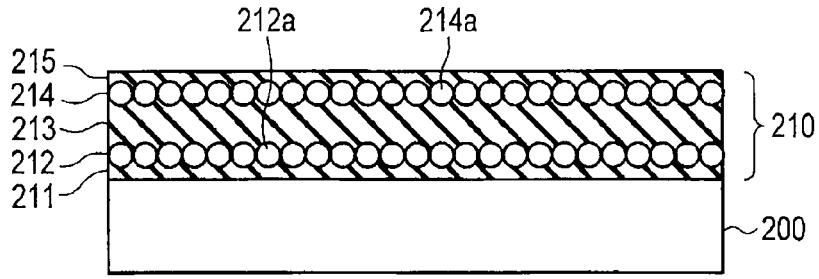
FIGS. 5A to 5C are sectional views to explain the process of manufacturing a nonvolatile semiconductor memory according to a second embodiment.
Figure 5B:
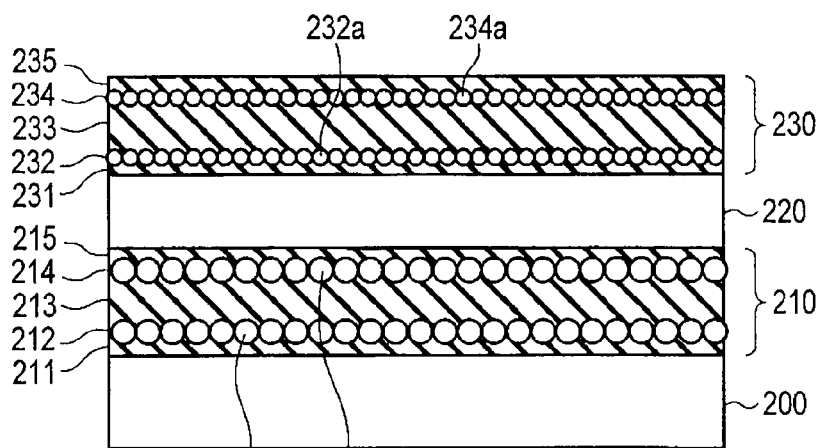
Figure 5C:
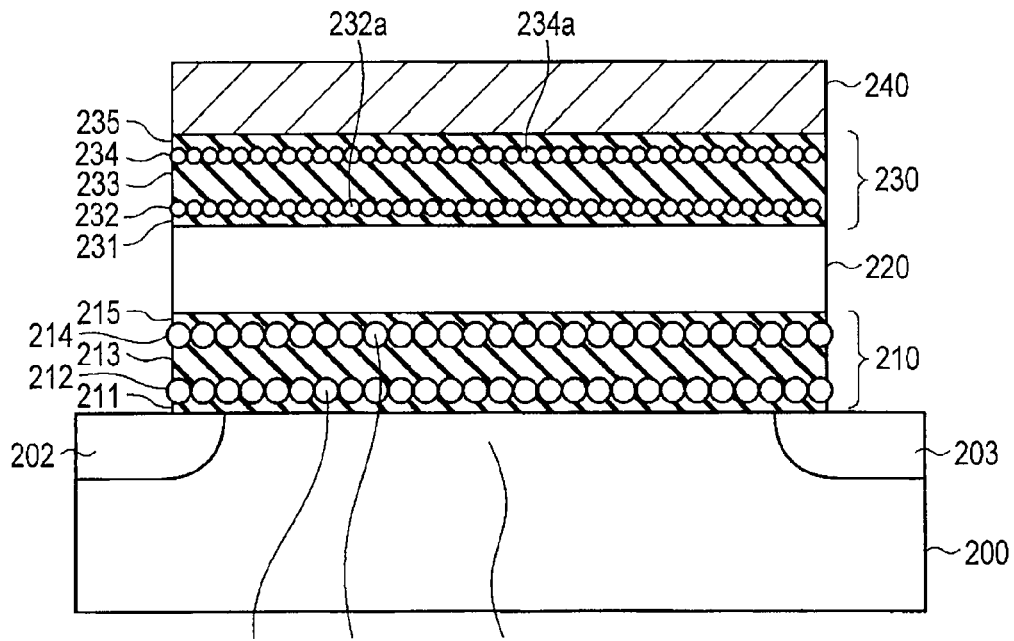

FIGS. 5A to 5C are sectional views to explain the process of manufacturing a nonvolatile semiconductor memory (a floating-gate memory with the particle diameter differing between the portion above and that below the charge storage part) according to a second embodiment.

As shown in FIG. 5A, a thermally oxidized film 211 with a thickness of Tox=1 nm is formed on an Si substrate 200. On the thermally oxidized film 211, an a-Si layer is deposited to a thickness of 2 nm by means of a CVD apparatus. Thereafter, on the surface of the a-Si layer, a 1-nm-thick oxide film 213 of $SiO_2$ or the like is formed by thermal oxidation, producing a structure where a 1.5-nm-thick a-Si layer is sandwiched between the 1-nm-thick oxide films vertically.

Next, when high-temperature annealing is done at 950° C. in an atmosphere of nitrogen, the a-Si layer is turned into an Si nanocrystal layer (a first particle layer) 212 composed of Si nanocrystals (first conductive particles) 212a of about the same size as the thickness of the a-Si film, producing the same structure as in FIG. 2B. On the Si nanocrystal layer 212, a 3-nm-thick oxide film is stacked by LPCVD techniques to increase the thickness of the oxide film 213 on the Si nanocrystal layer 212 to a total of 4 nm and then an a-Si layer is deposited to a thickness of 2 nm by means of the CVD apparatus. Then, a 1-nm-thick oxide film 215 is formed on the surface of the a-Si layer by thermal oxidation, producing a structure where a 1.5-nm-thick a-Si layer is sandwiched between the oxide films 213, 215 vertically. Thereafter, when high-temperature annealing is done at 950° C. in an atmosphere of nitrogen, the upper a-Si layer is turned into an Si nanocrystal layer (a first particle layer) 214 composed of Si nanocrystals (first conductive particles) 214a of about the same size as the thickness of the a-Si film. As a result, a tunnel insulating film (a first gate insulating film) 210 composed of the oxide film 211, Si nanocrystal layer 212, oxide film 213, Si nanocrystal layer 214, and oxide film 215 is formed.

Next, as shown in FIG. 5B, a 10-nm-thick polysilicon film to serve as a floating gate 220 is formed by LPCVD techniques. Then, after a 1-nm-thick oxide film 231 is formed on the floating gate 220, an a-Si layer is deposited to a thickness of 1.5 nm by means of the CVD apparatus. On the surface of the a-Si layer, a 1-nm-thick oxide film 233 is formed by thermal oxidation. As a result, the a-Si layer has a thickness of 1 nm on the polysilicon and is sandwiched between the 1-nm-thick oxide films 231, 233 vertically.

Next, when high-temperature annealing is done at 950° C. in an atmosphere of nitrogen, the a-Si layer on the polysilicon is turned into an Si nanocrystal layer (a second particle layer) 232 composed of Si nanocrystals (second conductive particles) 232a of a 1-nm size. On the Si nanocrystal layer, a 3-nm-thick oxide film of $SiO_2$ or the like is stacked by LPCVD techniques to increase the thickness of the oxide film 233 on the Si nanocrystal layer 232 to a total of 4 nm and then an a-Si layer is deposited to a thickness of 1.5 nm by means of the CVD apparatus. Then, a 1-nm-thick oxide film 235 is formed on the surface of the a-Si layer by thermal oxidation, producing a structure where a 1-nm-thick a-Si layer is sandwiched between the oxide films 233, 235 vertically. Thereafter, when high-temperature annealing is done at 950° C. in an atmosphere of nitrogen, the top upper a-Si layer is turned into an Si nanocrystal layer (a second particle layer) 234 composed of Si nanocrystals (second conductive particles) 234a of about the same size as the thickness of the a-Si film. As a result, a interelectrode insulating film (a second gate insulating film) 230 composed of the oxide film 231, Si nanocrystal layer 232, oxide film 233, Si nanocrystal layer 234, and oxide film 235 is formed.

After crystals of about the same size as the thickness of the a-Si film have been formed, lateral crystal growth is less liable to take place in a thin nano-film because of the tendency to maintain the crystal state where the surface energy is the lowest. Therefore, adjusting the nitrogen annealing conditions enables the particle diameters of the Si nanocrystals 212a, 214a, 232a, 234a whose typical sizes are about the film thickness to be controlled.

Next, as shown in FIG. 5C, on the interelectrode insulating film 230, a 200-nm-thick n+ polysilicon layer to serve as a gate electrode 240 is deposited by CVD techniques. Then, with a resist pattern as a mask, etching is selectively performed to form a gate electrode part. Thereafter, phosphorus is implanted at a dose of $1\times10^{15}$ cm$^{-2}$ at an incident energy of 5 keV and is then subjected to rapid annealing at 1000° C. for 10 seconds, thereby forming an n+ diffused layer to function as the source/drain regions 202, 203. This makes it possible to form a floating gate memory favorable for miniaturization which enables memory retention to be improved, while maintaining high-speed writing at low voltages.

Next, the reason why the memory with the structure of the second embodiment is helpful in miniaturization will be explained with reference to energy band diagrams in FIGS. 6A and 6B. FIG. 6A shows a memory retention state and FIG. 6B shows a write voltage applied state.

The smaller the particle diameter of the silicon particle, the higher the energy barrier ΔE in a silicon nanocrystal. Therefore, as shown in FIG. 6A, $\Delta E_1$ of the lower Si nanocrystals 212a, 214a is lower than ΔE of the upper Si nanocrystals 232a, 234a.

In writing, a suitable write voltage is applied to inject electrons from the channel into the floating gate 220 acting as a charge storage part as shown in FIG. 6B, causing electrons to go over $\Delta E_1$ of the lower Si nanocrystals 212a, 214a, which enables high-speed writing. On the other hand, information electrons in the floating gate 220 cannot go over the upper Si nanocrystals 232a, 234a because of the existence of an energy barrier resulting from ΔE being higher than $\Delta E_1$. Therefore, the Si nanocrystal layers 232, 234 function as block layers.

Similarly, in erasing, the same voltage is applied in a direction opposite to that in writing, which enables erasing to be done with the larger-particle-diameter side used as a tunnel layer and the smaller-particle-diameter side used as a block layer. In retaining data, memory can be retained for a long time according to $\exp(\Delta E/k_B T)$ since energy barriers $\Delta E_1$, ΔE produced by the Si nanocrystal layers 212, 214, 232, 242 existing on both sides have to be exceeded. Therefore, in the second embodiment, not only the tunnel insulating film 210 but also interelectrode insulating film 230 can be thinned remarkably, producing a structure favorable for the miniaturization of memory devices.

It is known that in the floating gate memory, use of an overlap cell structure makes miniaturization more difficult. However, in the second embodiment, since high energy barriers produced by the Si nanocrystals 232a, 234a with smaller particle diameters block current even in a write/erase operation, a flat cell structure favorable for miniaturization that requires no overlap structure can be realized.

While in the second embodiment, the particle diameter of the Si nanocrystals 212a, 214a on the channel side are made larger than that of the Si nanocrystals 232a, 234a on the gate side, the particle diameter on the channel side may be made smaller than that on the gate side instead. In this case, the information charge injection/ejection between the gate and the charge storage part can be reversed vertically to produce a block layer between the channel and the charge storage layer, which produces a memory structure favorable for miniaturization in a similar way.

In addition, while in the second embodiment, the particle diameter of the Si nanocrystals 212a and 214a on the channel side is made the same as that of the Si nanocrystals 232a and 234a on the gate side, this is not restrictive. What is need is that the particle diameter of the Si nanocrystals 232a is smaller than that of the Si nanocrystals 212a and the particle diameter of the Si nanocrystals 234a is smaller than that of the Si nanocrystals 214a. As in the above example, in this case, the Si nanocrystal layer 212 functions as a tunnel layer and the Si nanocrystal layer 232 functions as a block layer at the time of writing, and the Si nanocrystal layer 214 functions as a tunnel layer and the Si nanocrystal layer 234 functions as a block layer at the time of erasing. Therefore, the Si nanocrystals 212a and 214a may differ in particle diameter and the Si nanocrystals 232a and 234a may differ in particle diameter. For instance, the Si nanocrystals 212a may have a particle diameter of 1.8 nm, the Si nanocrystals 214a a particle diameter of 1.5 nm, the Si nanocrystals 232a a particle diameter of 1.2 nm, and the Si nanocrystals 234a a particle diameter of 1 nm.

While in the second embodiment, each of the channel side and gate side has two Si nanocrystal layers in such a manner that the Si nanocrystal layers 212, 214 are provided on the channel side and the Si nanocrystal layers 232, 234 are provided on the gate side, a single Si nanocrystal layer may be provided on each of the channel side and gate side. FIG. 7 shows an example of providing only the Si nanocrystal layers 212, 232. This structure can be formed by eliminating the Si nanocrystal layer 214 and oxide film 215 and the Si nanocrystal layer 234 and oxide film 235 from the structure of FIG. 5C.

In a case as shown in FIG. 7, when a suitable write voltage is applied at the time of writing, this causes electrons to go over $\Delta E_1$ of the lower Si nanocrystals 212a, enabling high-speed writing via the Si nanocrystal layer 212. On the other hand, since information electrons in the charge storage part cannot go over the upper Si nanocrystals 232a because of the existence of an energy barrier resulting from ΔE being higher than $\Delta E_1$, the Si nanocrystal layer 232 functions as a block layer similarly.

At the time of erasing, when attention is focused on holes on the valence band side, the facts that an energy barrier to holes is formed in an Si nanocrystal and that an energy barrier is higher as the particle diameter is smaller are the same as in the above example. Therefore, applying a suitable erase voltage causes holes to go over $\Delta E_1^{hole}$ of the lower Si nanocrystals 212a, which enables erasing. On the other hand, holes in the charge storage part cannot go over the upper Si nanocrystals 232a because of the existence of an energy barrier resulting from $\Delta E^{hole}$ being higher than $\Delta E_1^{hole}$. Therefore, the Si nanocrystal layer 232 functions as a block layer in erasing.

Although in FIG. 7, the oxide films 213, 233 are as thick as 4 nm, the oxide films 213, 233 may be made as thin as 1 nm. This can be done by eliminating the process of increasing the thickness of the oxide films by LPCVD techniques. In this case, applying a suitable write voltage in a write/erase operation causes electrons to go over $\Delta E_1$ of the lower Si nanocrystals 212a, which enables high-speed writing/erasing. On the other hand, information electrons in the charge storage part cannot go over the upper Si nanocrystals 232a because of the existence of an energy barrier resulting from ΔE being higher than ΔE₁. Therefore, the Si nanocrystal layer 232 functions as a block layer.

At the time of retaining memory, electrons have to go over the energy barriers ΔE₁, ΔE, and therefore memory can be retained for a long time according to exp(ΔE/k_BT). In this case, it is necessary to stipulate more accurate process conditions for the formation of Si nanocrystals leaving no space between them.

As described above, the Si nanocrystals 212a, 232a are arranged below and above the floating gate 220 serving as a charge storage part, respectively, and are made different in particle diameter. At least one of the oxide films 211, 231 sandwiching each of the Si nanocrystal layers 212, 232 between them vertically can be made as thin as about 1 nm. This makes it possible to obtain a memory structure favorable for miniaturization by thinning the interelectrode insulating film 230 acting as a block layer.

Third Embodiment

Figure 8A:
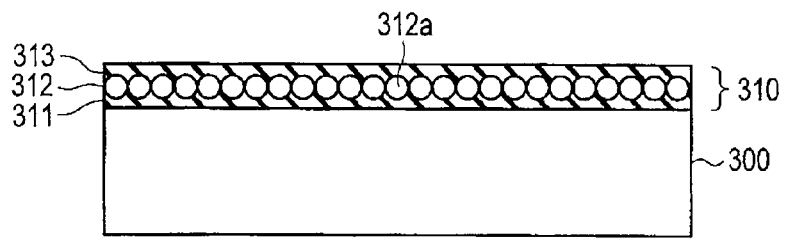
FIGS. 8A to 8C are sectional views to explain the process of manufacturing a nonvolatile semiconductor memory according to a third embodiment.
Figure 8B:
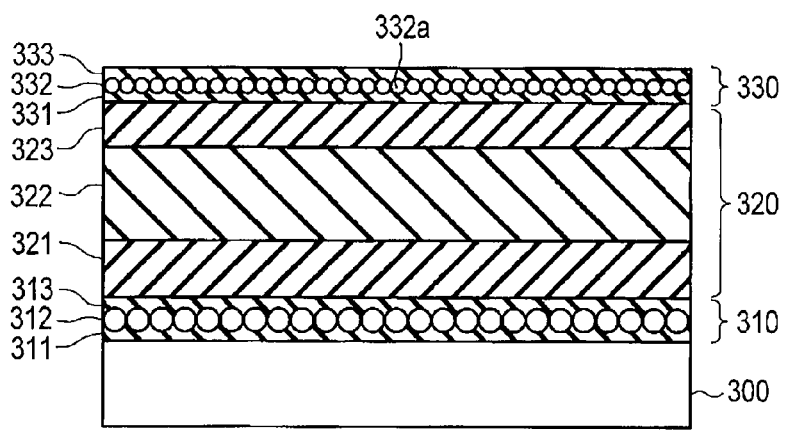
Figure 8C:
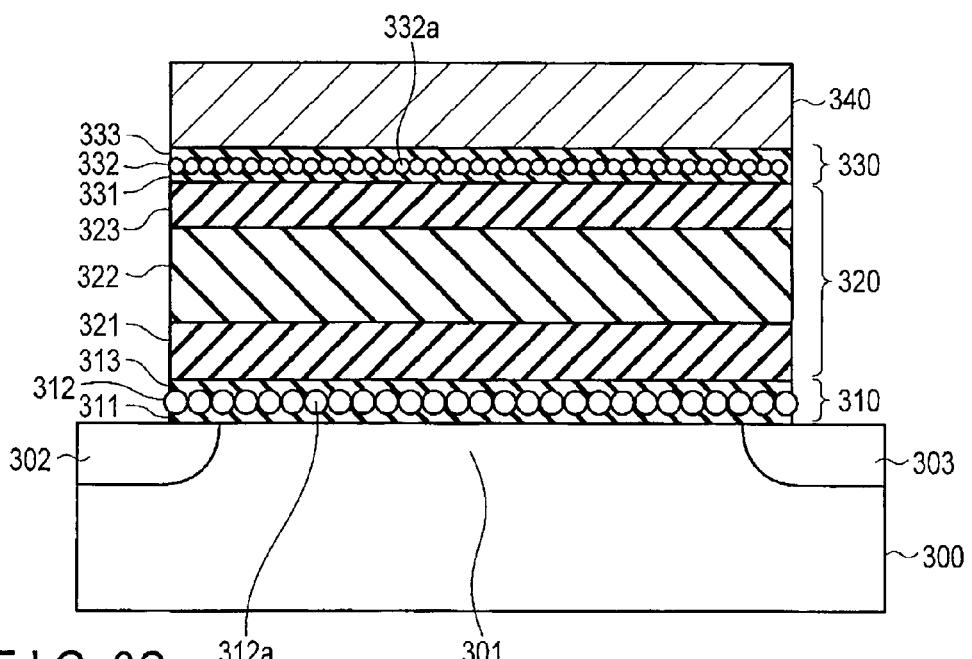

FIGS. 8A to 8C are sectional views to explain the process of manufacturing a nonvolatile semiconductor memory (a two-layer charge storage part MONOS memory with the particle diameter differing between the upper part and lower part of the charge storage part) according to a third embodiment.

As shown in FIG. 8A, a thermally oxidized film 311 with a thickness of Tox=1 nm is formed on an Si substrate 300. On the thermally oxidized film 311, an a-Si layer is deposited to a thickness of 2 nm by means of a CVD apparatus. Then, on the surface of the a-Si layer, a 1-nm-thick oxide film 313 is formed by thermal oxidation, producing a structure where a 1.5-nm-thick a-Si layer is sandwiched between the 1-nm-thick oxide films 311, 313 vertically. Next, when high-temperature annealing is done at 950° C. in an atmosphere of nitrogen, the a-Si layer is turned into an Si nanocrystal layer (a first particle layer) 312 composed of Si nanocrystals (first conductive particles) 312a of about the same size as the thickness of the a-Si film. This produces a tunnel insulating film (a first gate insulating film) 310 with a structure where the Si nanocrystal layer 312 is sandwiched between the oxide films 311, 313.

Next, as shown in FIG. 8B, after a 5-nm-thick Si nitride film 321 serving as a first charge storage layer is formed by LPCVD techniques, a 10-nm-thick alumina (aluminum oxide) film 322 is formed and then a 5-nm-thick Si nitride film 323 serving as a second charge storage layer is formed by LPCVD techniques. That is, a charge storage part 320 with a structure where the alumina film 322 is sandwiched between the two charge storage layers 321, 323.

Then, a 1-nm-thick oxide film 331 of $SiO_2$ or the like is formed by LPCVD techniques, an a-Si layer is deposited to a thickness of 1.5 nm by means of the CVD apparatus, and a 1-nm-thick oxide film 333 is formed on the surface of the a-Si layer by thermal oxidation. This produces a structure where the upper a-Si layer has a thickness of 1 nm and the a-Si layer is sandwiched between the 1-nm-thick oxide films 331, 333 vertically. Then, when high-temperature annealing is done at 950° C. in an atmosphere of nitrogen, the a-Si layer is turned into an Si nanocrystal layer (second particles) 332 composed of Si nanocrystals (second conductive particles) 332a of the nanometer size. As a result, a block insulating film (a second gate insulating film) 330 with a structure that has the Si nanocrystal layer 332 sandwiched between the oxide films 331, 333 is formed.

After crystals about the same size as the thickness of the a-Si film have been formed, lateral crystal growth is less liable to take place in a thin Si nano-film because of the tendency to maintain the crystal state where the surface energy is the lowest. Therefore, adjusting the nitrogen annealing conditions enables the particle diameters of the Si nanocrystals 312a, 332a whose typical sizes are about the film thickness to be controlled. Since the typical sizes are determined by the film thickness, the typical size of the lower Si nanocrystals 312a is 1.5 nm and that of the upper Si nanocrystals 332a is 1 nm.

Next, as shown in FIG. 8C, on the block insulating film 330, a 200-nm-thick n⁺ polysilicon layer to serve as a gate electrode 340 is deposited by CVD techniques. Then, with a resist pattern as a mask, selective etching is done to form a gate electrode part. Thereafter, phosphorus is implanted at a dose of $1 \times 10^{15}$ cm$^{-2}$ at an incident energy of 5 keV and is then subjected to rapid annealing at 1000° C. for 10 seconds, thereby forming an n⁺ diffused layer to function as the source/drain regions 302, 303. As a result, a floating gate memory device capable of improving memory retention while maintaining low-voltage, high-speed writing can be formed.

Figure 9A:
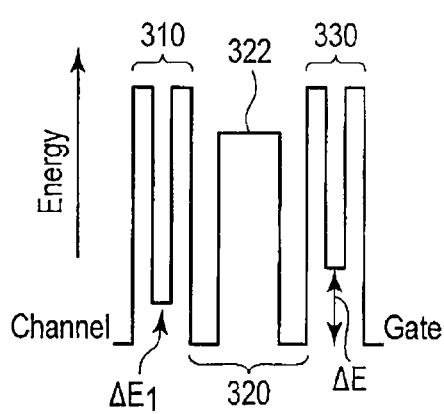
FIGS. 9A to 9C show energy bands in the nonvolatile semiconductor memory of the third embodiment.

Next, the reason why the memory with the structure of the third embodiment is helpful for a multilevel configuration will be explained with reference to energy band diagrams in FIGS. 9A to 9C. FIG. 9A shows a memory holding state, FIG. 9B shows a state where a write voltage is applied to a lower charge storage part, and FIG. 9C shows a state where a write voltage is applied to an upper charge storage part.

The smaller the particle diameter of an Si particle, the higher the energy barrier ΔE in the silicon particle. Therefore, as shown in FIG. 9A, ΔE₁ of the lower Si nanocrystal 312a is lower than ΔE of the upper Si nanocrystal 132a.

Figure 9B:
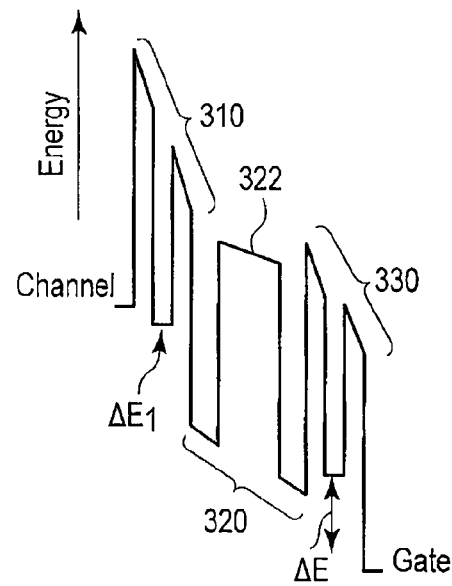

When the lower charge storage layer 321 is to be written to, a suitable write voltage is applied in an erased state as shown in FIG. 9B, causing electrons to go over ΔE₁ of the lower Si nanocrystal 312a, which enables high-speed writing. At this time, on the opposite side of the charge storage layer 321, information electrons are blocked by the alumina film 322. On the other hand, electrons cannot go over the upper Si nanocrystals 332a because of the existence of an energy barrier resulting from ΔE being higher than ΔE₁, which prevents charges from coming in and going out. Therefore, only the lower charge storage layer 321 can be written to.

Figure 9C:
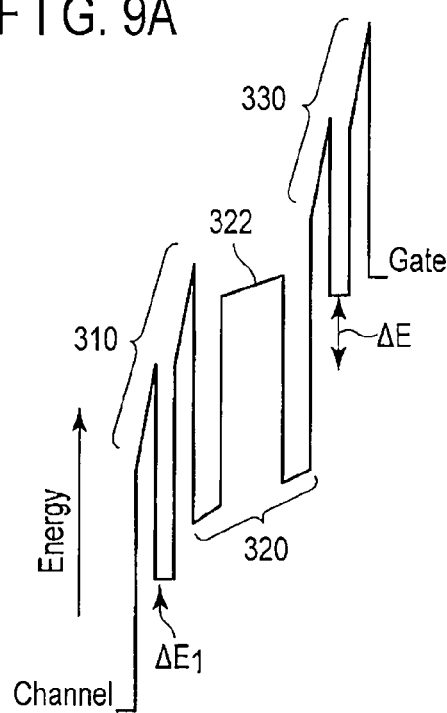

When the upper charge storage layer 323 is to be written to, a higher voltage than that of FIG. 9B is reversely applied in an erased state as shown in FIG. 9C. Electrons go over ΔE of the upper Si nanocrystals 332a, enabling high-speed writing of the upper charge storage layer 323 from the gate. At this time, on the opposite side of the charge storage layer 323, information electrons are blocked by the alumina film 322. On the other hand, in the lower charge storage layer 321, since ΔE₁ is lower than ΔE, there is a possibility that electrons will go over an energy barrier and excessive erasing to the substrate will occur. When excessive erasing has been done, the excessively erased part should be offset by the process of writing to the same lower charge storage layer 323 as in FIG. 9B in a second step. By doing this, only the upper charge storage layer 323 can be written to.

When both the upper and lower charge storage layers 321, 323 are to be written to, only the lower charge storage layer 321 of FIG. 9B is written to in a state where only the upper charge storage layer 323 has been written to.

Therefore, by several pulse voltage applying operations, a state where only the lower charge storage layer is written to, a state where only the upper charge storage layer is written to, and a state where both the upper and lower charge storage layers are written to can be created from an erased state. Since individual threshold voltage values differ, it is seen that a multilevel configuration can be provided using (0, 0), (1, 0), (0, 1), (1, 1) states.

Returning to an erased state also can be performed by several pulse voltage applications. For example, when a voltage of the same magnitude is applied in the opposite direction of FIG. 9C, erasing can be done from the upper charge storage layer 323 to the gate. Then, when a voltage of the same magnitude is applied in the opposite direction of FIG. 9B, only the lower charge storage layer is erased from, enabling both the upper and lower charge storage layers to be brought into an erased state. In a memory holding state, information charges in the upper and lower charge storage layers are blocked an energy barrier produced by the upper and lower Si nanocrystals and the alumina film, which retains memory for a long time. Therefore, a multilevel memory can be realized, while maintain high-speed writing at low voltages.

Although four levels per memory element are used in the above examples, the number of bits per element may be favorably increased. If the threshold shift caused by information charges in the lower charge storage layer 321 is $\Delta Vth1$ and the threshold shift caused by information charges in the upper charge storage layer 323 is $\Delta Vth2$, the total threshold shift is $\Delta Vth=\Delta Vth1+\Delta Vth2$ as a result of the superposition of electromagnetic fields. For example, an attempt to set eight levels per element at threshold intervals of 1 V requires a normal maximum threshold shift amount $\Delta Vth$ max=7 V. In contrast, with the third embodiment, for example, the same setting can be done with, for example, $\Delta Vth1$ max=4 V, $\Delta Vth2$ max=3 V, that is, with a smaller maximum threshold shift. That is, the voltage can be lowered, which is favorable for higher reliability.

Furthermore, in miniaturization, the smaller the area, the larger the threshold shift corresponding to the number of electrons not affected by a fluctuation in the number of electrons. The threshold shift corresponding to the number of electrons not affected by a fluctuation in the number of electrons is $\Delta Vth0$. For example, an attempt to use eight levels in small sizes without being affected by a fluctuation in the number of electrons normally requires Vth max=7 $\Delta Vth0$, seven times the maximum threshold difference. In contrast, with the third embodiment, the same thing can be done with $\Delta Vth1$ max=4 $\Delta Vth0$, $\Delta Vth1$ max=3 $\Delta Vth0$, that is, with a smaller maximum threshold shift. That is, the voltage can be lowered, which is favorable for higher reliability. As described above, the third embodiment provides a nonvolatile memory element favorable for a multilevel configuration.

While in the third embodiment, the particle diameter of the Si nanocrystals 312a on the channel side is larger than that of the Si nanocrystals 332a on the gate side, the particle diameter on the channel side may be smaller than that on the gate side. In this case, the information charge injection/ejection between the gate and the charge storage part can be reversed vertically to produce a block layer between the channel and the charge storage layer as needed, which produces a memory structure favorable for a multilevel configuration in a similar way.

Figure 10:
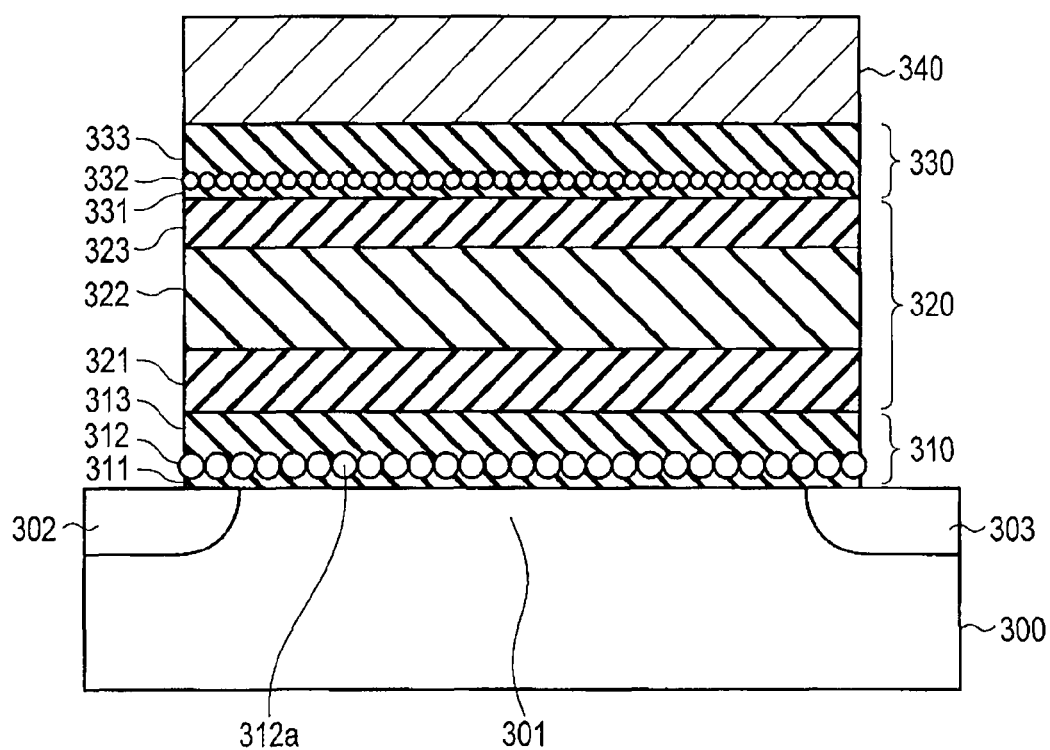
FIG. 10 is a sectional view showing an element structure according to a modification of the third embodiment.

In addition, while in the third embodiment, the oxide films 311, 313, 331, 333 each have a film thickness of 1 nm, if at least one of the oxide films sandwiching each Si nanocrystal layer between them vertically is as thin as about 1 nm, the other may be made thicker. FIG. 10 shows an example of the oxide films 313 and 333 being as thick as 4 nm. Such a thick oxide film can be formed by increasing the thickness of the oxide film by, for example, LPCVD techniques.

In a case as shown in FIG. 10, when the lower charge storage layer 321 is to be written to, a suitable write voltage is applied in an erased state to a gate positive direction, causing electrons to go over $\Delta E_1$ of the lower Si nanocrystal 312a, which enables high-speed writing. At this time, on the opposite side of the charge storage layer 321, information electrons are blocked by the alumina film 322. On the other hand, electrons cannot go over the upper Si nanocrystals 332a because of the existence of an energy barrier resulting from $\Delta E$ being higher than $\Delta E_1$, which prevents charges from coming in and going out. Therefore, only the lower charge storage layer 321 can be written to.

When attention is focused on holes on the valence band side, the facts that an energy barrier to holes is formed in an Si nanocrystal and that an energy barrier is higher as the particle diameter is smaller are the same as in the above examples. When the upper charge storage layer 323 is to be written to, a suitable voltage is applied in an erased state in a gate negative direction, causing holes to go over $\Delta E^{hole}$ of the upper Si nanocrystals 332a from the charge storage part to the gate, which enables writing to be done. At this time, on the opposite side of the charge storage layer 323, information electrons are blocked by the alumina film 322. On the other hand, in the lower charge storage layer 321, since $\Delta E_1^{hole}$ is lower than $\Delta E^{hole}$, there is a possibility that holes will go over an energy barrier and be injected excessively from the substrate into the charge storage layer 321, resulting in excessive erasing. When excessive erasing has been done, the excessively erased part should be offset by the process of writing only to the lower charge storage layer 321 at a suitable gate positive voltage in a second step. By doing this, only the upper charge storage layer 323 can be written to.

When both the upper and lower charge storage layers 321, 323 are to be written to, only the lower charge storage layer 321 is written to in a state where only the upper charge storage layer 323 has been written to. Therefore, by several pulse voltage applying operations, a state where only the lower charge storage layer is written to, a state where only the upper charge storage layer is written to, and a state where both the upper and lower charge storage layers are written to can be created in an erased state.

As described above, the two charge storage layers 321, 323 are provided, the upper and lower Si nanocrystals are made different in particle diameter, and at least one of the oxide films sandwiching each of the Si nanocrystal layers between them vertically is made as thin as about 1 nm, which enables a memory structure favorable for a multilevel configuration to be obtained.

Fourth Embodiment

FIGS. 11A to 11C are sectional views to explain the process of manufacturing a nonvolatile semiconductor memory (a two-layer charge storage part floating-gate memory with the particle diameter differing between the upper and lower parts of the charge storage part) favorable for a multilevel configuration according to a fourth embodiment.

As shown in FIG. 11A, formed on an Si substrate 400 are a thermally oxidized film 411 with a thickness of Tox=1 nm, an Si nanocrystal layer (a first particle layer) 412 composed of Si nanocrystals (first conductive particles) 412a with a particle diameter of about 1.5 nm, a 4-nm-thick oxide film 413 of $SiO_2$ or the like, an Si nanocrystal layer (a first particle layer) 414 composed of Si nanocrystals (first conductive particles) 414a with a particle diameter of about 1.5 nm, and a 1-nm-thick thermally oxidized film 415. A method of forming the individual layers 411 to 415 constituting a tunnel insulating film (a first gate insulating film) 410 is the same as the method of FIG. 5A shown in the second embodiment.

Next, as shown in FIG. 11B, a 10-nm-thick polysilicon film serving as a lower floating gate 421 acting as a first charge storage layer is formed by LPCVD techniques. Then, a block layer 450 that has a 10-nm-thick alumina (aluminum oxide) 452 sandwiched between thin 2-nm-thick oxide films 451, 453 is formed by CVD techniques. Then, a 10-nm-thick polysilicon film serving as an upper floating gate 422 acting as a second charge storage layer is formed by LPCVD techniques.

Next, formed on the floating gate 422 are a 1-nm-thick thermally oxidized film 431, an Si nanocrystal layer (a second particle layer) 432 composed of Si nanocrystals (second conductive particles) with a particle diameter of about 1 nm, a 4-nm-thick oxide film 433, an Si nanocrystal layer (a second particle layer) 434 composed of Si nanocrystals (second conductive particles) with a particle diameter of about 1 nm, and a 1-nm-thick thermally oxidized film 435. A method of forming the individual layers 431 to 435 constituting an interelectrode insulating film (a second gate insulating film) 430 is the same as the method of FIG. 5B shown in the second embodiment.

After crystals about the same size as the thickness of the a-Si film have been formed, lateral crystal growth is less liable to take place in a thin Si nano-film because of the tendency to maintain the crystal state where the surface energy is the lowest. Therefore, adjusting the nitrogen annealing conditions enables the particle diameters of the Si nanocrystals 412a, 414a, 432a, 434a whose typical sizes are about the film thickness to be controlled.

Next, as shown in FIG. 11C, on the interelectrode insulating film 430, a 200-nm-thick n$^+$ polysilicon layer to serve as a gate electrode 440 is deposited by CVD techniques. Then, with a resist pattern as a mask, selective etching is done to form a gate electrode part. Thereafter, phosphorus is implanted at a dose of $1 \times 10^{15}$ cm$^{-2}$ at an incident energy of 5 keV and is then subjected to rapid annealing at 1000° C. for 10 seconds, thereby forming an n$^+$ diffused layer to function as source/drain regions 402, 403. As a result, a floating gate memory is formed which is capable of improving memory retention while maintaining low-voltage, high-speed writing and is favorable for a multilevel configuration.

Figure 12A:
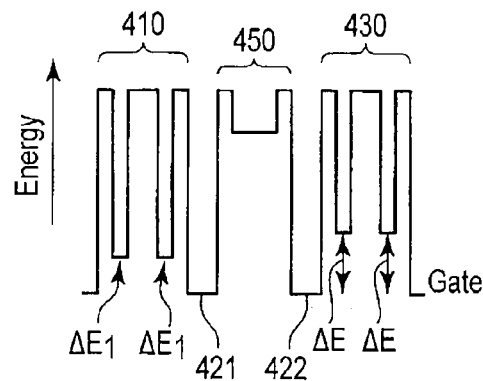
FIGS. 12A to 12C show energy bands in the nonvolatile semiconductor memory of the fourth embodiment.

Next, the reason why the memory with the structure of the fourth embodiment is favorable for a multilevel configuration will be explained with reference to energy band diagrams in FIGS. 12A to 12C. FIG. 12A shows a memory holding state, FIG. 12B shows a state where a write voltage applied is applied to a lower charge storage part, and FIG. 12C shows a state where a write voltage is applied to an upper charge storage part.

The smaller the particle diameter of an Si particle, the higher the energy barrier ΔE in the Si particle. Therefore, as shown in FIG. 12A, $\Delta E_1$ of the lower Si nanocrystals 412a, 414a is lower than ΔE of the upper Si nanocrystals 432a, 434a.

Figure 12B:
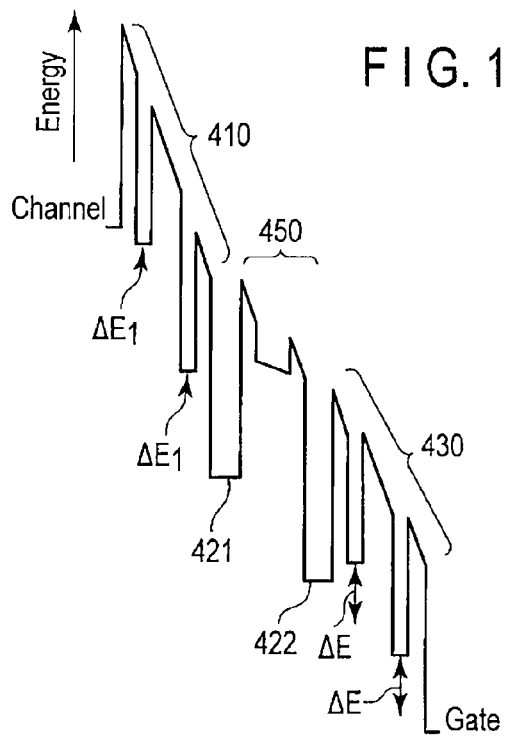

When the lower floating gate 421 is to be written to, a suitable write voltage is applied in an erased state as shown in FIG. 12B, causing electrons to go over $\Delta E_1$ of the lower Si nanocrystals 412a, 414a, which enables high-speed writing. At this time, on the opposite side of the lower floating gate 421, information electrons are blocked by the block layer 450. On the other hand, as shown in FIG. 12B, at the upper floating gate 422, electrons cannot go over the upper Si nanocrystals 432a, 434a because of the existence of an energy barrier resulting from ΔE being higher than $\Delta E_1$, which prevents charges from coming in and going out. Therefore, only the lower floating gate 421 can be written to.

Figure 12C:
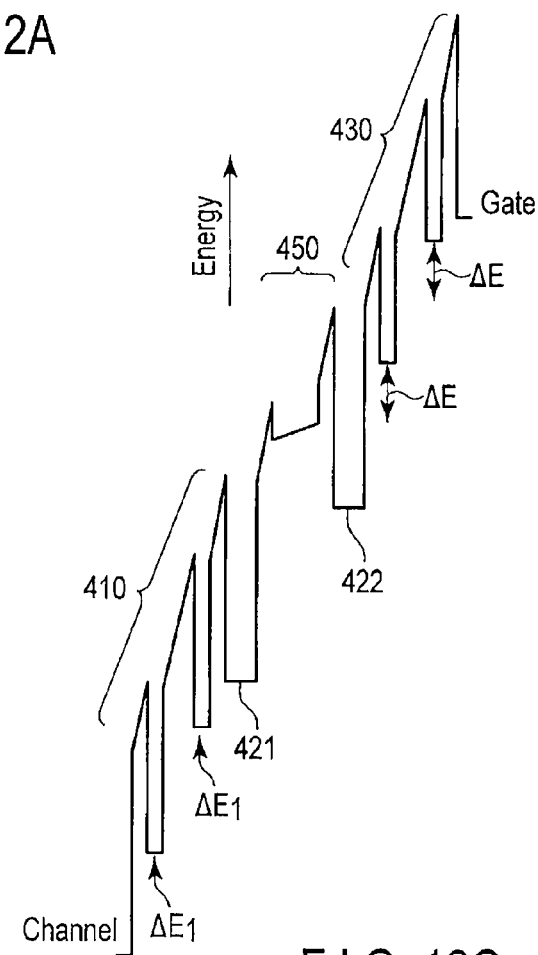

When the upper floating gate 422 is to be written to, a higher voltage than that of FIG. 12B is reversely applied in an erased state as shown in FIG. 12C. Electrons go over ΔE of the upper Si nanocrystals 432a, 434a, enabling high-speed writing of the upper floating gate 422 from the gate. At this time, on the opposite side of the upper floating gate 422, information electrons are blocked by the block layer 450. On the other hand, in the lower floating gate 421, since $\Delta E_1$ is lower than ΔE as shown in FIG. 12C, there is a possibility that electrons will go over the energy barrier and excessive erasing to the substrate will occur. When excessive erasing has been done, the excessively erased part should be offset by the process of writing to the same lower floating gate 421 as in FIG. 12B in a second step. By doing this, the upper floating gate 422 can be written to.

When both the upper and lower floating gates 421, 422 are to be written to, only the lower floating gate 421 of FIG. 12B is written to in a state where only the upper floating gate 422 has been written to.

Therefore, by several pulse voltage applying operations, a state where only the lower floating gate is written to, a state where only the upper floating gate is written to, and a state where both the upper and lower floating gates are written to can be created from an erased state. Since individual threshold voltage values differ, it is seen that a multilevel configuration can be provided using (0, 0), (1, 0), (0, 1), (1, 1) states.

Returning to an erased state can be performed by several pulse voltage applications. For example, when a voltage of the same magnitude is applied in the opposite direction of FIG. 12C, erasing can be done from the upper floating gate 422 to the gate. Then, when a voltage of the same magnitude is applied in the opposite direction of FIG. 12B, only the lower floating gate 421 is erased from, enabling both the upper and lower floating gates to be brought into an erased state. In a memory retention state, information charges in the upper and lower floating gates 421, 422 are blocked by an energy barrier produced by the upper and lower Si nanocrystals and the block layer 450, which retains memory for a long time. Therefore, a multilevel memory can be realized, while maintaining high-speed writing at low voltages.

Although four levels per memory element are used in the above example, the number of bits per element may be favorably increased. Therefore, the fourth embodiment provides a nonvolatile memory element favorable for a multilevel configuration.

As explained in the second embodiment, in the fourth embodiment, the Si nanocrystals 412a, 414a on the channel side and the Si nanocrystals 432a, 434a on the gate side may be reversed in size. In addition, the particle diameter of the Si nanocrystals 412a, 414a may be made different from that of the Si nanocrystals 432a, 434a.

While in the fourth embodiment, each of the channel side and gate side has two Si nanocrystal layers in such a manner that the Si nanocrystal layers 412, 414 are provided on the channel side and the Si nanocrystal layers 432, 434 are provided on the gate side, a single Si nanocrystal layer may be provided on each of the channel side and gate side. FIG. 13 shows an example of providing only the Si nanocrystal layers 412, 432. This structure can be formed by eliminating the Si nanocrystal layer 414 and oxide film 415 and the Si nanocrystal layer 434 and oxide film 435.

In a case as shown in FIG. 13, when the lower floating gate 421 is to be written to, a suitable write voltage is applied in an erased state in a gate positive direction, causing electrons to go over $\Delta E_1$ of the lower Si nanocrystals 412a, which enables high-speed writing. At this time, on the opposite side of the floating gate 421, information electrons are blocked by the block layer 450. On the other hand, electrons cannot go over the upper Si nanocrystals 432a because of the existence of an energy barrier resulting from ΔE being higher than ΔE$_1$, which prevents charges from coming in and going out. Therefore, only the lower floating gate 421 can be written to.

When attention is focused on holes on the valence band side, the facts that an energy barrier to holes is formed in an Si nanocrystal and that an energy barrier is higher as the particle diameter is smaller are the same as in the above examples. When the upper floating gate 422 is to be written to, a suitable voltage is applied in an erased state in a gate negative direction, causing holes to go over ΔE$^{hole}$ of the upper Si nanocrystals 432a from the charge storage part to the gate, which enables writing to be done. At this time, on the opposite side of the floating gate 422, information electrons are blocked by the block layer 450. On the other hand, in the lower floating gate 421, since ΔE$_1^{hole}$ is lower than ΔE$^{hole}$, there is a possibility that holes will go over an energy barrier and be injected excessively from the substrate into the floating gate 421, resulting in excessive erasing. When excessive erasing has been done, the excessively erased part should be offset by the process of writing only to the lower floating gate 421 at a suitable gate positive voltage in a second step. By doing this, only the upper floating gate 422 can be written to.

When both the upper and lower floating gates 421, 422 are to be written to, only the lower floating gate 421 should be written to in a state where only the upper floating gate 422 has been written to. Therefore, by several pulse voltage applying operations, a state where only the lower floating gate is written to, a state where only the upper floating gate is written to, and a state where both the upper and lower floating gates are written to can be created in an erased state in the same manner.

While in FIG. 13, each of the oxide films 413, 433 is as thick as 4 nm, they may be made as thin as 1 nm. They can be formed by eliminating the process of increasing the thickness of the oxide films by LPCVD techniques. In this case, the same multilevel operation as in the third embodiment can be performed. Applying a suitable voltage in a write/erase operation causes electrons to go over ΔE$_1$ of the lower Si nanocrystals 412a, which enables only the lower charge storage part to be subjected to a write/erase operation. On the other hand, applying a little higher voltage causes electrons to go over ΔE, subjecting the upper charge storage part to a write/erase operation. At this time, when charges enter and leave the lower charge storage part, this can be offset by subjecting only the lower charge storage part to a write/erase operation as shown in FIG. 10.

In addition, since electrons have to go over energy barriers ΔE1, ΔE in retaining memory, memory can be retained for a long time according to exp(ΔE/k$_B$T). In this case, it is necessary to stipulate more accurate process conditions for the formation of Si nanocrystals leaving no space between them.

As described above, the two floating gates 421, 423 are provided as charge storage parts, the upper and lower Si nanocrystals are made different in particle diameter, and at least one of the oxide films sandwiching each of the Si nanocrystal layers between them vertically is made as thin as about 1 nm, which enables a memory structure favorable for a multilevel configuration to be obtained.

Fifth Embodiment

Figure 14A:
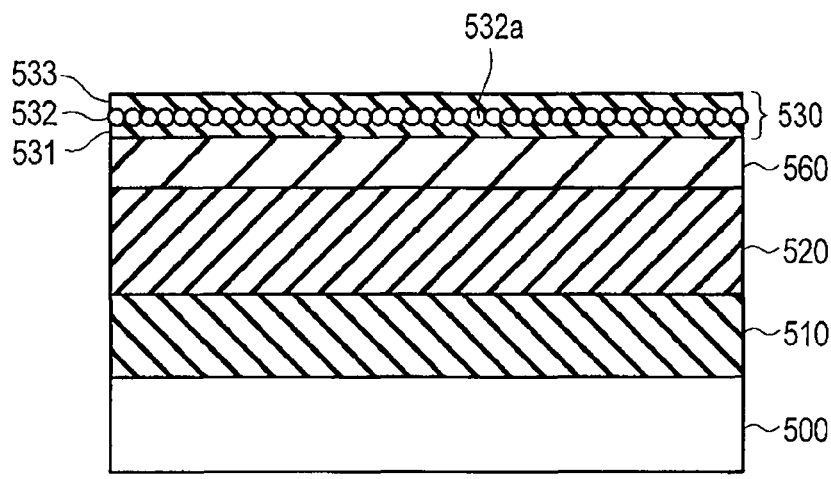
FIGS. 14A and 14B are sectional views to explain the process of manufacturing a nonvolatile semiconductor memory according to a fifth embodiment.
Figure 14B:
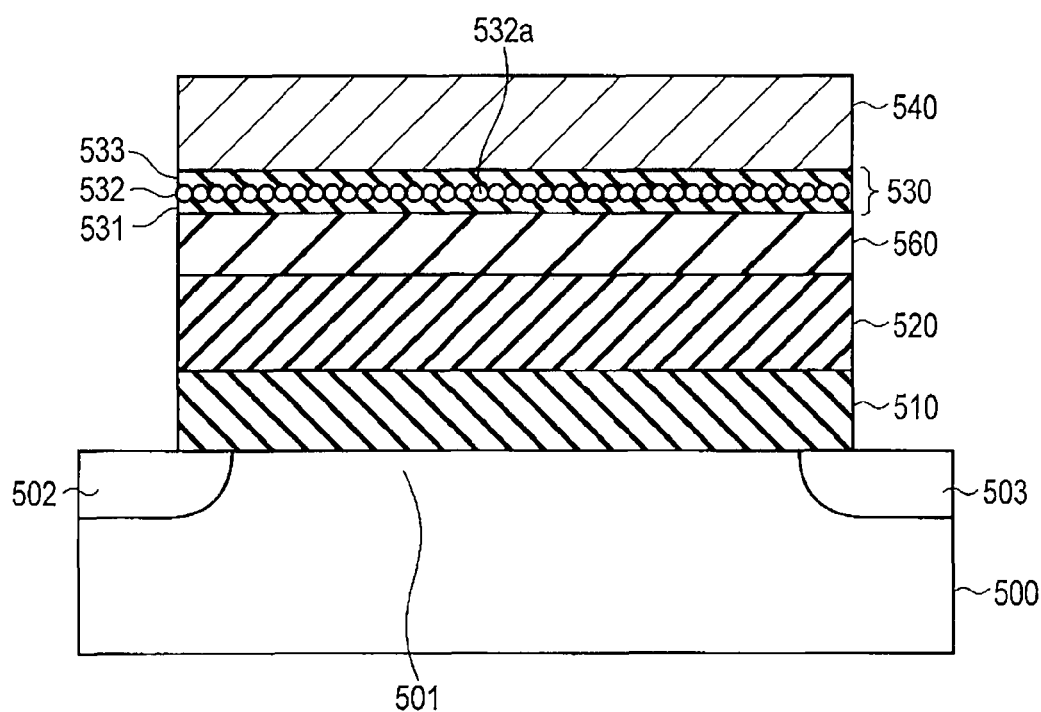

FIGS. 14A, 14B are sectional views to explain the process of manufacturing a nonvolatile semiconductor memory (a MONOS memory with a submicroscopic Si nanocrystal layer in a block layer) according to a fifth embodiment.

First, as shown in FIG. 14A, a tunnel oxide film (a first gate insulating film) 510 with a thickness of Tox=5 nm is formed on an Si substrate 500. On the tunnel oxide film, a 5-nm-thick Si nitride film 520 serving as a charge storage part is formed with an LPCVD apparatus. Further on the Si nitride film 520, alumina (aluminum oxide) is formed to a thickness of 6 nm by CVD techniques. Then, a 1-nm-thick oxide film 531 of SiO$_2$ or the like is formed by CVD techniques and then an a-Si layer is deposited to a thickness of 1.3 nm. Thereafter, on the surface of the a-Si layer, a 1-nm-thick oxide film 533 of SiO$_2$ or the like is formed by thermal oxidation, causing a 0.8-nm-thick a-Si layer to be sandwiched between the 1-nm-thick oxide films 531, 533 vertically. In this state, when high-temperature annealing is done at 950° C. in an atmosphere of nitrogen, the a-Si layer is turned into a 0.8-nm-thick Si nanocrystal layer (particle layer) 532 of Si nanocrystals (conductive particles) 532a. This produces a block insulating film (a second gate insulating film) 530 where the Si nanocrystal layer 532 is sandwiched between the oxide films 531, 533.

Next, as shown in FIG. 14B, on the block insulating film 530, a 200-nm-thick n$^+$ polysilicon layer to serve as a gate electrode 540 is deposited by CVD techniques. Then, with a resist pattern as a mask, etching is selectively performed to form a gate structure part. Thereafter, phosphorus is implanted at a dose of 1×10$^{15}$ cm$^{-2}$ at an incident energy of 5 keV and is then subjected to rapid annealing at 1000° C. for 10 seconds, thereby forming an n$^+$ diffused layer to function as source/drain regions 502, 503. As a result, a memory device favorable for miniaturization is formed.

Figure 15A:
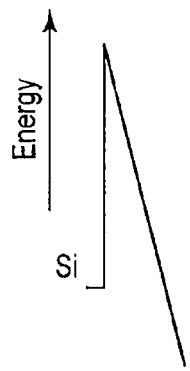
FIGS. 15A and 15B show energy bands in the nonvolatile semiconductor memory of the fifth embodiment.
Figure 15B:
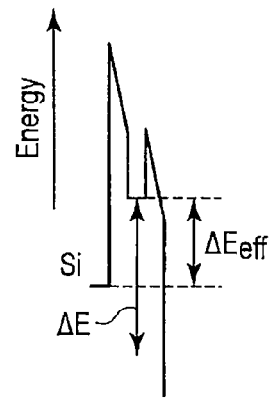

Next, the reason why the memory with the structure of the fifth embodiment is helpful in miniaturization will be explained with reference to energy band diagrams in FIGS. 15A and 15B. FIG. 15A is an energy band diagram of a tunnel film in a write voltage applied state. FIG. 15B is an energy band diagram of an oxide film/Si nanocrystal layer/oxide film in a write voltage applied state.

In a memory which uses an ordinary Si oxide film as a tunnel film, a high-k film or a stacked structure of a high-k film and an oxide film is often used as a block layer. In the case of a MONOS memory that uses an insulating film including many traps, such as an Si nitride film, as a charge storage part, alumina is often used as a high-k film material used for a block layer. Therefore, the fifth embodiment relates to a MONOS memory which includes an Si nanocrystal layer with a submicroscopic particle diameter of 0.8 nm in a block layer.

The stacked structure of the block insulating film 530 (oxide film/Si nanocrystal layer/oxide film) just under the gate electrode 540 can allow lower current to flow in a write/erase operation than the tunnel oxide film 510. Therefore, with the fifth embodiment, the insulation property of the block layer can be stepped up and therefore the film thickness of the alumina film 560 as a high-k film can be thinned by that much. Accordingly, the effective film thickness of the entire block layer can be made thinner, producing a structure favorable for the miniaturization of memory elements.

The reason why a 1-nm-thick oxide film/Si nanocrystal/1-nm-thick oxide film allows lower current to flow in a write/erase operation than an oxide film will be explained. Since a typical electric field in a write/erase operation is about at 13 MV/cm in the case of a NAND flash or the like, current at this electric field value should be smaller in a stacked structure of a 1-nm-thick oxide film/Si nanocrystal/a 1-nm-thick oxide film than in a 5-nm-thick oxide film. In the case of a 5-nm-thick oxide film, since a tunnel current becomes FN current passing through a triangular potential as shown in FIG. 15A, the FN current is about 1 A/cm$^2$ at 13 MV/cm with an ordinary FN tunnel effective mass value of 0.46.

On the other hand, in the case of a 1-nm-thick oxide film/Si nanocrystal/1-nm-thick oxide film, current passes through an energy barrier ΔE produced by the Si nanocrystal. A theory that deals with current passing through a double junction is known as the Orthodox theory. The total tunnel current is given by multiplying an effective energy barrier ΔEeff in the Si nanocrystal by $\exp(-\Delta E_{eff}/k_B T)$ for tunnel current only in the oxide films on both sides (where kg is the Boltzmann constant and T is a normal room temperature of about 300K absolute temperature).

Incidentally, from FIG. 15B, it follows that ΔEeff=ΔE−13 [mV/cm]×Tox×q (Tox being a thin oxide film thickness of 1 nm and q being elementary charge). Specifically, if the 1-nm-thick oxide film has a tunnel resistance value of R, current will be roughly given by $\{13MV/cm \times 2Tox/(2R)\} \times \exp\{-(\Delta E - 13 MV/cm \times Tox \times q)/k_B T\}$.

The tunnel resistance R can be calculated by setting a general effective mass when a film is thin at about 0.3 in Simons' formula, a general theoretical formula for direct tunnel current in an oxide film. The energy barrier ΔE is the sum of Coulomb blockade energy in an Si nanocrystal and quantum confinement energy. The Coulomb blockade energy is estimated to be $q2/(2\pi d\epsilon)$ (ε being the permittivity of the oxide film) for the size (diameter) d of the Si nanocrystal. The quantum confinement is estimated to be $3 \times \{h^2/(8m_{eff}d^2)\}$ by summing energy in three directions, x, y, z, where h is Planck's constant and $m_{eff}$ is a greater effective mass that creates the lowest energy state in conduction band electron effective masses in Si.

Figure 16:
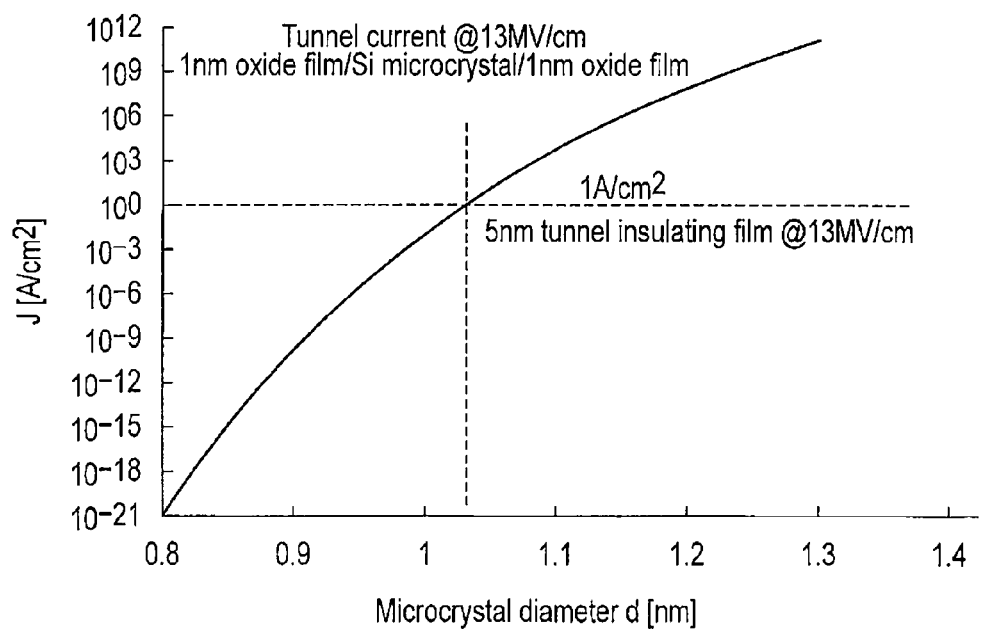
FIG. 16 is a characteristic diagram showing the relationship between Si nanocrystal diameter and leak current.

As described above, current for the Si nanocrystal d can be estimated. As shown in FIG. 16, if the particle diameter d is smaller than about 1 nm, current can be made lower than 1 A/cm² at 13 MV/cm in a 5-nm-thick oxide film. Therefore, if the particle diameter of the Si nanocrystal layer 532 is made smaller than 1 nm, it is expected that the stacked structure (oxide film/Si nanocrystal film/oxide film) 530 will allow lower current to flow than the tunnel oxide film 510 and therefore can function as a block film.

FIG. 16 is a diagram showing the dependence of the oxide film/Si nanocrystal layer/oxide film current density on the particle diameter of the Si nanocrystal on the basis of the Orthodox theory when an electric field of 13 MV/cm is applied. The energy barrier ΔE was calculated on the assumption that Si nanocrystals were isolated in an oxide film. Actually, they were produced at a high density in an Si nanocrystal layer. Therefore, the energy barrier becomes lower than that of the Si nanocrystals isolated in the oxide film in the case of the same particle diameter because of the interaction between Si nanocrystals and therefore the current block effect is small. Accordingly, if the Si nanocrystals have a borderline particle diameter of 1 nm, the insulation effect is insufficient and control of much smaller particle diameter is considered to be necessary. An indication of about 1 nm or less shown in FIG. 16 is the upper limit of the necessary minimum to achieve a higher insulation property than that of the tunnel oxide film.

Figure 17:
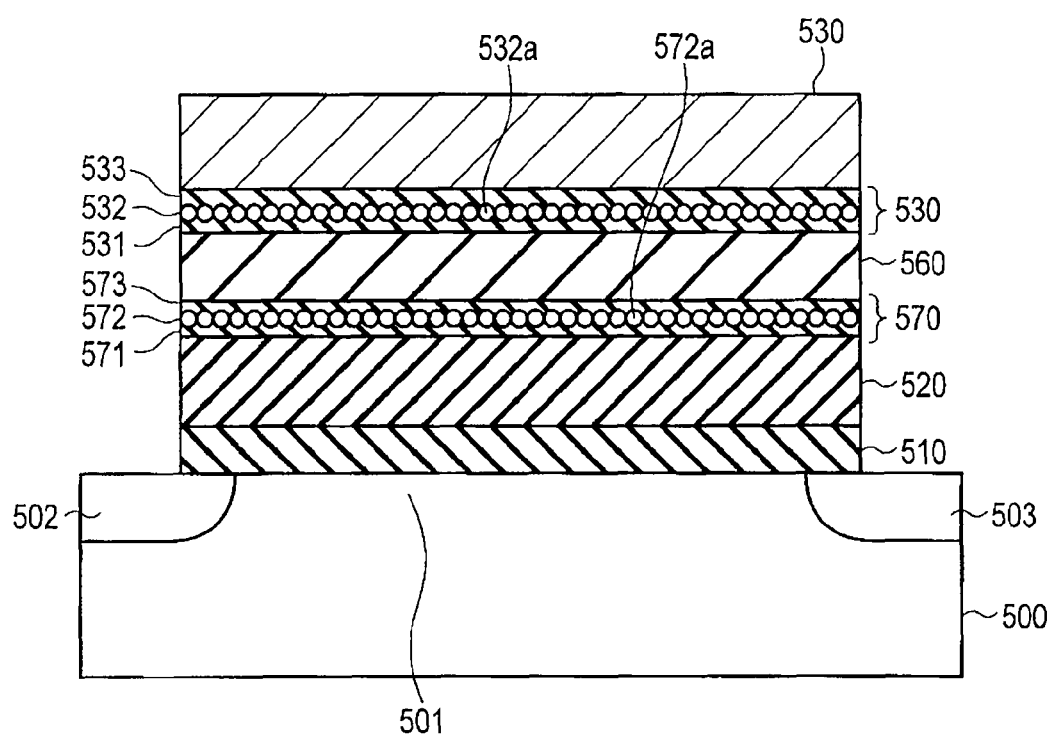
FIG. 17 is a sectional view showing an element structure according to a modification of the fifth embodiment.

In the fifth embodiment, the stacked structure of a 1-nm-thick oxide film/Si nanocrystal/1-nm-thick oxide film is on the gate side, producing a structure that has the effect of strengthening the block insulation property mainly in erasing. If the configuration has Si nanocrystals in the charge storage part, a block layer effect on writing can be mainly enhanced. FIG. 17 shows a configuration where the oxide films are on both sides as an example. After the formation of a charge storage part 520, the formation of an oxide film 571, an Si nanocrystal layer 572, and an oxide film 573 is added. The structure of FIG. 17 can enhance the block layer effect in a write/erase operation.

While in the fifth embodiment, the oxide films 531, 533 are on both sides of the Si nanocrystal layer 532, the Si nanocrystal layer 532 may be directly on the high-k film (alumina) 560 without the oxide film 531 not on the carrier injection side. The formation of the oxide film 531 is eliminated. In this case, since alumina has a lower potential barrier than an oxide film, the energy barrier ΔE in the Si nanocrystal is lower at the same particle diameter and therefore an Si nanocrystal with a smaller particle diameter might be necessary.

As shown in FIGS. 15A, 15B and FIG. 16, use of an Si nanocrystal layer assures a higher insulation property than that of an ordinary tunnel Si oxide film. Therefore, in the fifth embodiment and in the example of FIG. 17, even the high-k block layer part without the alumina film 560 can be used as a block layer. In this case, submicroscopic particle diameters and more accurate process conditions for enabling density control leaving very small space between particles are necessary.

As described above, in the block layer, an Si nanocrystal layer with a submicroscopic particle diameter of at least 1 nm or less is provided and at least one of the oxide films sandwiching the Si nanocrystal layer between them vertically is made as thin as about 1 nm, which makes it possible to obtain a memory device favorable for miniaturization by thinning the block layer.

Sixth Embodiment

Figure 18A:
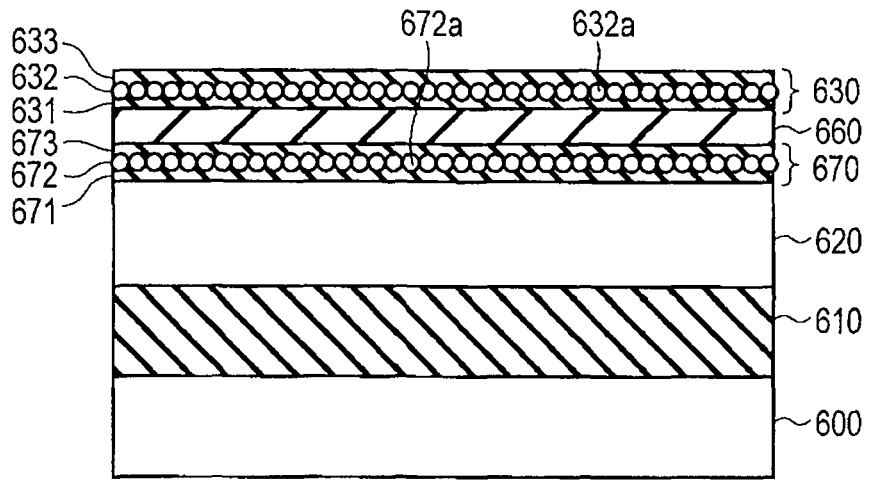
FIGS. 18A and 18B are sectional views to explain the process of manufacturing a nonvolatile semiconductor memory according to a sixth embodiment.
Figure 18B:
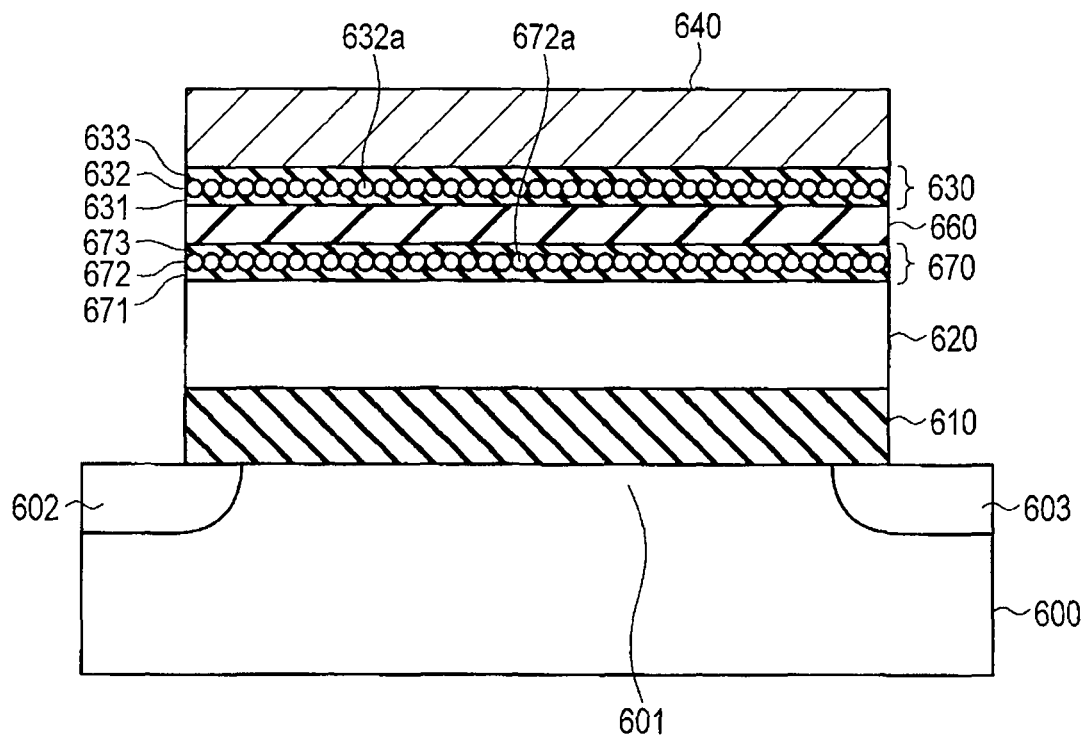

FIGS. 18A and 18B are sectional views to explain the process of manufacturing a nonvolatile semiconductor memory (an Si nanocrystal layer block layer floating-gate memory) according to a sixth embodiment.

As shown in FIG. 18A, a tunnel oxide film (a first gate insulating film) 610 with a thickness of Tox 8 nm is formed on an Si substrate 600. On the tunnel oxide film, a 10-nm-thick polysilicon film 620 serving as a charge storage part is formed with an LPCVD apparatus. Then, a 1-nm-thick oxide film 671 of $SiO_2$ or the like is formed by CVD techniques. In addition, an a-Si layer is deposited to a thickness of 1.3 nm. On the surface of the a-Si layer, a 1-nm-thick oxide film 673 is formed by thermal oxidation. As a result, the a-Si layer has a thickness of 0.8 nm and is sandwiched between the 1-nm-thick oxide films 671, 673 vertically.

In this state, when high-temperature annealing is done at 950° C. in an atmosphere of nitrogen, the a-Si layer is turned into an Si nanocrystal layer 672 composed of Si nanocrystals 672a of about a 0.8-nm size. Thereafter, an 8-nm-thick alumina film 660 is stacked by LPCVD techniques. In addition, a 1-nm-thick oxide film 631 of $SiO_2$ or the like is formed by CVD techniques and an a-Si layer is deposited to a thickness of 1.3 nm. On the surface of the a-Si layer, a 1-nm-thick oxide film 633 is formed by thermal oxidation. In this state, when high-temperature annealing is done at 950° C. in an atmosphere of nitrogen, the a-Si layer is turned into an Si nanocrystal layer 632 composed of Si nanocrystals 632a of about a 0.8-nm size.

Next, as shown in FIG. 18B, a 200-nm-thick n⁺ polysilicon layer to serve as a gate electrode 640 is deposited by CVD techniques. Then, with a resist pattern as a mask, selective etching is performed so as to form a gate structure part. Thereafter, phosphorus is implanted at a dose of $1 \times 10^{15}$ cm$^{-2}$ at an incident energy of 5 keV and is then subjected to rapid annealing at 1000° for 10 seconds, thereby forming an n⁺ diffused layer to function as source/drain regions 602, 603. As a result, a memory device favorable for miniaturization is formed.

Next, the reason why the memory with the structure of the sixth embodiment is favorable for miniaturization will be explained. In a memory that uses an ordinary Si oxide film as a tunnel film, a high-k film or a stacked structure of a high-k film and an oxide film is often used as a block layer. As in the fifth embodiment, in the sixth embodiment, alumina is used. Therefore, the sixth embodiment is a floating gate memory which includes an Si nanocrystal layer with a submicroscopic particle diameter of 0.8 nm in the block layer.

A stacked structure of a 1-nm-thick oxide film/a 0.8-nm-thick Si nanocrystal film/a 1-nm-thick oxide film between the charge storage part 620 and the gate electrode 640 can allow lower current to flow than the tunnel oxide film 620 in a write/erase operation. Therefore, in the sixth embodiment, since the insulation property of the block layer can be enhanced, the high-k film 660 can be made thinner by that much. Accordingly, the effective film thickness of the entire block layer can be made thinner, producing a structure favorable for the miniaturization of memory elements.

The reason why the Si nanocrystal structures 630, 670 allow lower current to flow than the oxide film 610 is the same as explained in the fifth embodiment. That is, an Si nanocrystal layer with a microparticle diameter of at least 1 nm or less might have a higher insulation property than that of an oxide film in a write/erase operation and therefore function as a block layer.

While in the sixth embodiment, the particle diameters of the Si nanocrystals 632a and 672a have been set to the same 0.8 nm, the Si nanocrystals 632a and 672a may differ in particle diameter because they each can function as a block layer in a write/erase operation, provided that the particle diameter is 1 nm or less. For instance, the particle diameter of the Si nanocrystal 672a may be 0.7 nm and that of the Si nanocrystal 632a be 0.8 nm.

While in the sixth embodiment, alumina has been used as a high-k block layer material as in the fifth embodiment, use of another high-k material produces the same effect. When a polysilicon floating gate electrode or the like is used as a charge storage part, an Si nitride film is often used as a high-k block layer material and oxide film/nitride film/oxide film (ONO) stacked structure, nitride film/oxide film/nitride film/oxide film/nitride film (NONON) stacked structure, or the like is used as a block layer. When a nitride film is used in place of alumina 660, an 8-nm-thick Si nitride film is formed by LPCVD techniques instead of forming alumina.

Figure 19:
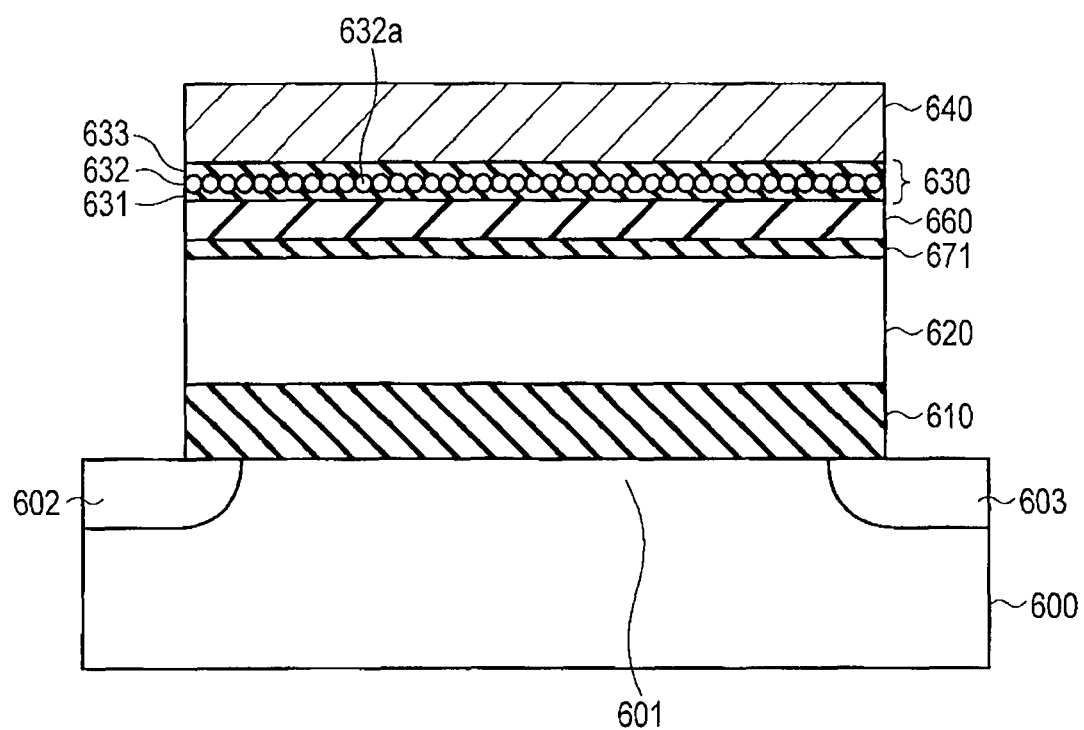
FIG. 19 is a sectional view showing an element structure according to a modification of the sixth embodiment.

While in the sixth embodiment, the two Si nanocrystal layers 632, 672 have been used, even use of a single nanocrystal layer can be expected to produce an advantageous effect. FIG. 19 shows an example of using only the Si nanocrystal layer 632. This structure can be formed by eliminating the formation of the Si nanocrystal layer 672 and oxide film 673. In addition, the formation of the oxide film 671 may be eliminated. In a case as shown in FIG. 19, since the injection of electrons from the gate is less than the emission of electrons from the charge storage part by the 5-nm-thick tunnel oxide film 610 mainly in an erase operation as shown in FIG. 16, the Si nanocrystal layer can function as a block layer.

As shown in FIG. 16, use of the Si nanocrystal layer assures a higher insulation property than that of an ordinary tunnel Si oxide film. Therefore, in the sixth embodiment and in the example of FIG. 19, the Si nanocrystal layer can used as a block layer even with a configuration without alumina 660, a high-k block layer part, or a nitride film. In this case, submicroscopic particle diameters and more accurate process conditions for enabling density control leaving very small space between particles are required.

(Explanation of Optimum Conditions)

Next, several favorable conditions for the six embodiments to produce effects will be explained. Although an explanation will be given using a case where oxide films are used as insulating films that sandwich conductive particles between them, insulating films excluding oxide films may be applied in a similar way.

The six embodiments use a tunnel phenomenon via an energy level formed by the confinement of carriers in conductive particles, such as Si nanocrystals, in a tunnel insulating film. Specifically, since there is no quantum-mechanical condition in an energy range of $\Delta E$ in conductive particles, when $\Delta E$ blocks the passage of carriers as in memory retention, the fact that carriers energetically have no option but to go over an energy barrier of $\Delta E$ is used. This enables effects to be achieved effectively when the energy level $\Delta E$ of the conductive particles is higher than heat fluctuation $k_B T$ (where $k_B$ is Boltzmann constant, T is absolute temperature, and $k_B T$ at room temperature is about 26 meV).

$\Delta E$ is determined by Coulomb blockade energy when conductive particles are metallic material and by Coulomb blockade energy and quantum confinement energy when conductive particles are semiconductors. Coulomb blockade energy, one of the main causes of $\Delta E$, is given roughly by $q/(2\pi\epsilon d)$ where the particle diameter (diameter) is d, provided that a conductive particle is spherical or roughly spherical in shape. Here, q is elementary charge and $\epsilon$ is the permittivity of tunnel insulating film material. Using these, a preferable range of the size d of a conductive particle can be estimated.

It is desirable that the particle diameter d of a conductive particle used in the six embodiments should satisfy the expression $q/(2\pi\epsilon d) > k_B T$, that is, $d < dmax = q/(2\pi\epsilon k_B T)$. When a typical tunnel insulating film is an Si oxide film, it follows that dmax=30 nm. In the case of such a semiconductor as an Si nanocrystal, it is desirable that quantum confinement energy should be higher than heat fluctuation $k_B T$.

Quantum confinement is estimated to be $3\times\{h^2/(8m_{eff}d^2)\}$, including three directions, x, y, z. Here, h is Planck's constant and $m_{eff}$ is electron effective mass determined by a band structure. Therefore, $d < dmax2 = \{3h^2/(8m_{eff}k_B T)\}^{1/2}$ is much preferable to $3\times\{h^2/(8m_{eff}d^2)\} > k_B T$. In the case of the most typical Si nanocrystal, meff is a greater effective mass that creates the lowest energy state in conduction band electron effective masses in Si. In addition, dmax2=6.5 nm. The lower limit of the particle diameter of a nanocrystal is considered to be about 0.3 nm, the size of an Si atom.

The six embodiments make use of the fact that when carriers attempt to pass through at least one of the thin oxide films sandwiching Si nanocrystals between them, they pass through at high speed if they can go over the energy barrier in the Si nanocrystals and they are blocked when they cannot go over the energy barrier. Accordingly, if at least one of the thin oxide films itself is too thick, when carriers go over the energy barrier, they are not accelerated sufficiently to high speed because of the resistance of the tunnel film itself. A typical electric field in writing is at about 13 MV/cm=1.3 V/nm. Therefore, if at least one of the thin oxide films sandwiching Si nanocrystals between them has a thickness of 2.4 nm, a tunnel potential becomes a triangular potential shown in FIG. 15A because the conduction band potential of the Si oxide film is as high as 3.1 eV in an electric field of 1.3 V/nm. Accordingly, this is actually the same as the FN tunnel of the oxide film itself, preventing writing from being done at sufficiently high speed. Therefore, if at least one of the thin oxide films sandwiching Si nanocrystals between them is made thinner than 2.4 nm, writing can be done faster than in the oxide film.

As described above, a thin tunnel oxide film formed in contact with the Si nanocrystal layer has a lower tunnel resistance as the tunnel oxide film is made thinner. Therefore, for example, the thin tunnel oxide film is helpful in performing a high-speed write/erase operation on the side where the particle diameter is larger. In addition, for example, to block carriers on the side where the particle diameter is smaller, it is preferable to make the thin tunnel oxide film as thin as possible. That is, making the tunnel oxide film thinner makes the effective energy barrier (ΔEeff in FIG. 15B) higher in the same electric field, which is preferable. Therefore, a typical case of at least one of the thin oxide films sandwiching the Si nanocrystals between them is that the oxide film is made thinnest in a controllable range. The thinnest oxide film that is controllable is considered to be normally about 1 nm.

In the first to fourth embodiments, attention is focused on the difference in particle diameter between the upper and lower Si nanocrystals of the charge storage part and one with the smaller particle is used as a block layer as needed. When the lower one of the upper and lower nanocrystal layers of the charge storage part is thinner, an electric field not lower than $\Delta E_1/q\text{Tox}1$ must be applied to the tunnel film to achieve speeding up by eliminating an energy barrier in a write operation as shown in FIG. 3B. Here, suppose the energy barrier of the lower (larger particle diameter side) Si nanocrystal layer (112 in FIG. 1, 212 in FIGS. 5A to 5C, 312 in FIGS. 8A to 8C, 412 in FIGS. 11A to 11C) is $\Delta E_1$ and the film thickness of the tunnel film on the channel side (111 in FIG. 1, 211 in FIGS. 5A to 5O, 311 in FIGS. 8A to 8C, 411 in FIGS. 11A to 11C), that is, the film thickness of the thinner film, is Tox1.

Next, if the energy barrier of the upper (smaller particle diameter side) Si nanocrystal layer (132 in FIG. 1, 232 in FIGS. 5A to 5C, 332 in FIGS. 8A to 8C, 432 in FIGS. 11A to 11C) is $\Delta E$ ($>\Delta E_1$) and the film thickness of the tunnel film on the storage part side (131 in FIG. 1, 231 in FIGS. 5A to 5C, 331 in FIGS. 8A to 8C, 431 in FIGS. 11A to 11C), that is, the film thickness of the thinner film, is Tox, the energy barrier of the upper Si nanocrystal layer to the charge storage part when the lowest electric field $\Delta E_1/q\text{Tox}1$ for high-speed writing via the lower Si nanocrystal layer is expressed as $\Delta E-\Delta E_1\times(\text{Tox}/\text{Tox}1)$. To cause the upper Si nanocrystal layer to function as a block layer with this energy barrier, it is required at minimum that the height is greater than heat fluctuation energy $k_BT$. The minimum required energy difference meets the following expression:

$$\Delta E-\Delta E_1\times(\text{Tox}/\text{Tox}1)>k_BT$$

A condition for the particle diameter can be derived from the Coulomb blockade energy $q/(2\pi d\epsilon)$, one of the main causes of the energy barrier. If the particle diameter of the lower (larger particle diameter side) Si nanocrystal is $d_1$ [nm] and that of the upper (smaller particle diameter side) Si nanocrystal is $d$ [nm], a favorable particle diameter difference meets the following expression:

$$d1>d\times(\text{Tox}/\text{Tox}1)/\{1-k_BT(2\pi\epsilon d)/q\}$$

Making the thin tunnel oxide film as thin as possible is preferable to high-speed writing on the larger particle diameter side because the tunnel resistance becomes low. In addition, to block carriers on the smaller particle diameter side, it is preferable because the energy barrier becomes higher in the same electric field. Accordingly, it is expected that the tunnel oxide film will be thinned to the thinnest film thickness (about 1 nm) that can be normally controlled. When Tox and Tox1 are almost equal, a typical film thickness is considered to be obtained. Therefore, typical conditions are as follows:

Minimum required energy difference is expressed as $$\Delta E-\Delta E_1>k_BT$$

Minimum required particle diameter difference is expressed as $$d1>d/\{1-k_BT(2\pi\epsilon d)/q\}$$

Here, if the tunnel insulating film part is an Si oxide film, $\epsilon$ is the permittivity of the Si oxide film, and room temperature is used, it follows that $d_1>d/(1-d/30$ nm$)$.

Under the physical condition $\Delta E-\Delta E_1>k_BT$, even if a case where a controllable thinnest Si oxide film with a thickness of about 1 nm is considered using thicknesses Tox [nm] and Tox1 [nm], the difference between an electric field that can go over the upper energy barrier and an electric field that can go over the lower energy barrier is expressed as $(\Delta E/q\text{Tox})-(\Delta E_1/q\text{Tox}1)>0.26$ [MV/cm]. The embodiments are characterized by causing the smaller particle diameter side to function as a block layer as needed, depending on the difference. However, since the electric field applied to the tunnel film in a write/erase operation is about 13 MV/cm, the difference is only several percents, which is not sufficient to obtain effects. Therefore, it is desirable that $\Delta E$ and $\Delta E_1$ should differ much more from each other. If the electric field difference is not less than 1 MV/cm (=0.1 V/nm), about 10% or more effect can be expected, which is much preferable. Specifically, it is far preferable to satisfy the following expression:

$$\Delta E/q\text{Tox}-\Delta E_1/q\text{Tox}1\geq 0.1\text{ V/m, that is,}$$

$$\Delta E-\Delta E_1\times(\text{Tox}/\text{Tox}1)\geq 0.1\text{ [eV/nm]}\times\text{Tox}$$

As for particle diameter, the following is a much preferable condition:

$$d_1>d\times(\text{Tox}/\text{Tox}1)/\{1-0.1\text{ [eV/nm]}\times\text{Tox}(2\pi\epsilon d)/q\}$$

Taking into account a case where typical controllable thinnest film thicknesses satisfy the equation Tox=Tox1=1 nm, it is far preferable to satisfy the following expressions:

$$\Delta E-\Delta E_1\geq 0.1\text{ [eV]}$$

$$d_1>d/\{1-0.1\text{ [eV]}\times(2\pi\epsilon d)/q\}$$

Here, if the tunnel insulating film part is an Si oxide film and $\epsilon$ is the permittivity of the Si oxide film, and room temperature is used, it follows that $d1>d/(1-d/8$ nm$)$.

Furthermore, if the effect of decreasing the electric field is not less than 2 MV/cm (=0.2 V/nm), a block layer effect can be expected with an electric field difference of about 20%, which is far preferable. That is, satisfying the following expression is much preferable:

$$\Delta E-\Delta E_1\times(\text{Tox}/\text{Tox}1)\geq 0.2\text{ [eV/nm]}\times\text{Tox}$$

As for particle diameter, the following is a more desirable condition:

$$d1\geq d\times(\text{Tox}/\text{Tox}1)/\{1-0.2\text{ [eV/nm]}\times\text{Tox}(2\pi\epsilon d)/q\}$$

Taking into account a case where typical controllable thinnest film thicknesses satisfy the equation Tox=Tox1=1 nm, it is far preferable to satisfy the following expressions:

$$\Delta E-\Delta E_1\geq 0.2\text{ [eV]}$$

$$d_1>d/\{1-0.2\text{ [eV]}\times(2\pi\epsilon d)/q\}$$

Here, if the tunnel insulating film part is an Si oxide film and c is the permittivity of the Si oxide film, and room temperature is used, it follows that $d1>d/(1-d/4$ nm$)$.

The embodiments are applied to the miniaturization of and the multilevel configuration of memory elements making use of a block effect in a write/erase operation produced by a high energy barrier of Si nanocrystals. An Si nanocrystal layer is provided on each of the thin oxide film on the channel face below the charge storage part and the thin oxide film in contact with the top of the charge storage part above the charge storage part. If the two Si nanocrystal layers differ in particle diameter, either one of the two can be used as a block film. Alternatively, if an Si nanocrystal layer is provided on each of the underside of the thin oxide film in contact with the underside of the charge storage part below the charge storage part and the underside of the thin oxide film in contact with the underside of the gate above the charge storage part. If the two Si nanocrystal layers differ in particle diameter, either one of the two can be used as a block film. Further alternatively, if an Si nanocrystal layer with a particle diameter of smaller than 1 nm is included in an ordinary tunnel Si oxide film and in a high-k block layer structure on the opposite side of the charge storage part and is formed so as to be in contact with the gate or charge storage part via an oxide film as thin as about 1 nm, the Si nanocrystal layer can be used to enhance the insulation property of the high-k block structure.

While in the first to sixth embodiments, an Si oxide film has been used as a tunnel insulating film material, another insulating material produces the same effect. As for at least one of the thin tunnel films sandwiching the Si nanocrystals between them, a material other than an Si oxide film produces the same effect, provided that its tunnel resistance is lower than that of a 2.4-nm-thick Si oxide film and its film thickness is smaller than 2.4 nm. Even if the thicker tunnel film is of a material other than an Si oxide film, the same effect is obtained. The thicker film particularly can be caused to have a stacked structure. For instance, the oxide film 233 of the second embodiment or the oxide film 133 of FIG. 4 is caused to have a structure that has a high-permittivity high-k film material sandwiched between oxide films, such as an oxide film/nitride film/oxide film (ONO) stacked structure or an oxide film/alumina/oxide film (OAO), which enables the functioning of a block layer to be upgraded.

While in the fourth and sixth embodiments, alumina or an oxide film/alumina/oxide film (OAO) stacked structure has been used as the block insulating films 322, 450 between two layers of charge storage parts, an oxide film/nitride film/oxide film (ONO) stacked structure, another insulating material, or its stacked structure may be used. Since both upper and lower Si nanocrystals can be configured to make a write/erase operation easier, depending on the design of the particle diameter of the upper and lower Si nanocrystals, use of only an Si oxide film is possible. In addition, Si nanocrystal layers with a smaller particle diameter than that of the upper and lower Si nanocrystals of the two layers of charge storage parts can be used as the block layer structures 322, 450.

To obtain a sufficient effect as a memory, it is desirable that the charge storage part should cover the entire channel. In addition, to efficiently achieve high speed when carriers go over the energy barrier and an insulation property when carriers cannot go over the energy barrier, it is desirable that the Si nanocrystals of the embodiments should cover almost the whole surface of the charge storage part (or channel). In the above description, energy barriers $\Delta E$, $\Delta E_1$ and particle diameters d, d1 are distributed due to a little variation in the particle diameter in the Si nanocrystal layer. Therefore, conditions concerning $\Delta E$, $\Delta E_1$ and particle diameters d, d1 written in this specification are represented using average values in each Si nanocrystal layer.

While in the above description, particle diameters d, $d_1$ of conductive particles have been the diameters of spheres or sphere-like shapes, conductive particles actually do not necessarily take an accurate spherical form. In the case of a spherical form, the self-capacity of the sphere is given by $Cself=\pi \epsilon d$ with a diameter of d, with the result that Coulomb blockade energy is roughly represented as $q/(2Cself)=q/(2\pi \epsilon d)$. When the shape of a conductive nanocrystal is not close to a sphere, an effective particle diameter of d can be determined by $d=Cself/(\pi \epsilon)$ for self-capacity Cself determined according to the shape of the conductor.

If the average particle diameter of an Si nanocrystal in an Si nanocrystal layer is d, an average overhead cross-sectional area per Si nanocrystal is $\pi d^2/4$. Therefore, if Si nanocrystals are formed leaving no space between them, the area density is the reciprocal of the average overhead cross-sectional area $4/(\pi d^2)$. This is considered to be the upper limit of the Si nanocrystal area density. It is desirable that a desirable area density to sufficiently produce the effect of a block layer used in the embodiments should be basically very density and as close to $4/(\pi d^2)$ as possible. If 10% of the channel surface is covered with an Si nanocrystal layer, the block insulating film is expected to be improved about 10%. Therefore, the lower limit of a desirable area density is $4/(10 \pi d^2)$. Similarly, If 20% of the channel surface is covered with an Si nanocrystal layer, the block insulating film is expected to be improved about 20%. Therefore, the lower limit of a more desirable area density is $4/(5\pi d^2)$.

(Modification)

This invention is not limited to the aforementioned embodiments and may be practiced or embodied in still other ways without departing from the spirit or essential character thereof.

While a single Si nanocrystal layer has been provided in each insulating film in the first, third, and fifth embodiments and two Si nanocrystal layers in each insulating film in the second, fourth, and sixth embodiments, one of the upper and lower insulating films may include a single Si nanocrystal layer and the other include two Si nanocrystal layers. In the first to sixth embodiments, up to two Si nanocrystal layers have been provided in the upper or lower insulating film of the charge storage part. However, even if three or more Si nanocrystal layers exist between two layers, they can function as block layers similarly as needed, provided that Si nanocrystal layers on the channel side, on underside of the charge storage part, on the top of the charge storage part, and near the gate side differ in particle diameter.

While in the first to sixth embodiments, an Si nanocrystal layer has been formed using Si nanocrystals formed by heating a thin a-Si film covering the whole surface of the channel, another forming method may be used, provided that the method can perform control of a variation in the dense particle diameters. In addition, although the source of supplying information charges to a floating gate is a channel semiconductor, $n^+$ Si of a control gate electrode may be used as a supply source, producing the same effect. Furthermore, not only a nonvolatile semiconductor memory based on an n-type MOSFET but also a nonvolatile semiconductor memory based on p-type MOSFET can be configured in the same manner.

Furthermore, while in the embodiments, an Si nitride film or $n^+$ polysilicon has been used for the charge storage part, another material capable of storing charge may be used. However, the material cannot produce an effect unless the energy level at which information charges are accumulated is lower than the energy barrier of any one of Si nanocrystals existing vertically.

While in the first to sixth embodiments, Si has been used for a semiconductor of a substrate, another semiconductor may be used. Although in the first to sixth embodiments, an Si nitride film or n-type polysilicon has been used for the charge storage part, another trap film material or another floating-electrode material may be used. In addition, particles are not necessarily limited to Si nanocrystals, conductive particles using semiconductor nanocrystals excluding Si may be used.

A MONOS memory or a floating gate memory can operate, provided that one of the upper and lower insulating films of the charge storage part is used as a tunnel insulating film and the other is used as a block insulating film. As seen from the embodiments, this invention makes use of the effect of blocking carriers from entering and leaving the channel, charge storage part, or gate at the insulating film corresponding to a block layer. For this reason, it is desirable that the memory should include the upper and lower tiny Si nanocrystal layers which are subjected to control of as dense particle diameters as possible and at least one of which has a film-thickness-controlled thin oxide film formed on it.

While in this specification, Si nanocrystals and thin tunnel Si oxide films have been mainly described, even if another material is composed of conductive nanocrystals, or even if a thin-film-thickness-controlled tunnel insulating film other than an Si oxide film is used, an improvement effect is obtained similarly by designing the particle diameter of conductive particles. In the case of a semiconductor, such as an Si nanocrystal, an energy battier is determined by Coulomb blockade energy and quantum confinement energy. In the case of metallic nano-particles, since the state density is high, an energy barrier is determined only by Coulomb blockade energy. In addition, when an insulating film other than an oxide film is used as a tunnel insulating film, optimum conditions can be determined using the individual expressions explained above (Explanation of optimum conditions).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory comprising:
a first gate insulating film which is formed on a channel region of a semiconductor substrate;
a first particle layer which is formed in the first gate insulating film and includes first conductive particles that satisfy Coulomb blockade conditions;
a charge storage part which is formed on the first gate insulating film;
a second gate insulating film which is formed on the charge storage part;
a second particle layer which is formed in the second gate insulating film, includes second conductive particles that satisfy Coulomb blockade conditions, and differs from the first conductive particles in average particle diameter; and
a gate electrode which is formed on the second gate insulating film,
wherein the charge storage part has an energy level of electron which is lower than an energy level of electron of the first and second particle layers when no voltage is applied between the gate electrode and the channel region,
an average energy $\Delta E_1$ for charging one electron in the first conductive particles is smaller than an average energy $\Delta E$ for charging one electron in the second conductive particles, and is higher than an energy level of the channel region when no voltage is applied between the gate electrode and the channel region, and
the difference between the average energy $\Delta E$ and the average energy $\Delta E_1$ satisfies the following expression:

$$\Delta E - \Delta E_1 > k_B T$$

where Boltzmann constant is $k_B$ and absolute temperature is T.

2. The memory of claim 1, wherein each of the first and second gate insulating films comprises oxide films sandwiching a corresponding one of the first particle layer and the second particle layer between the oxide films and at least one of the oxide films is formed so as to have such a thickness as makes its tunnel resistance lower than that of a 2.4-nm-thick Si oxide film.

3. The memory of claim 2, wherein average particle diameter $d_1$ [nm] of the ones with a larger particle diameter of the first conductive particles and the second conductive particles and average particle diameter d [nm] of the others with a smaller particle diameter fulfill the following relationship:

$$d_1 > d / \{1 - k_B T(2\pi \epsilon d)/q\}$$

where Boltzmann constant is $k_B$, absolute temperature is T, the permittivity of the oxide film is $\epsilon$, and elementary charge is q.

4. The memory of claim 2, wherein the difference between the average energy $\Delta E$ and the average energy $\Delta E_1$ satisfies the following expression:

$$\Delta E - \Delta E_1 \geq 0.1 \text{ [eV/nm]} \times \text{Tox}$$

where the film thickness of the thinner one of the oxide films sandwiching the particle layer producing the $\Delta E$ between them is Tox [nm].

5. The memory of claim 2, wherein average particle diameter $d_1$ [nm] of the ones with a larger particle diameter of the first conductive particles and the second conductive particles and average particle diameter d [nm] of the others with a smaller particle diameter fulfill the following relationship:

$$d_1 \geq d / \{1 - 0.1 \text{ [eV/nm]} \times \text{Tox}(2\pi \epsilon d)/q\}$$

where Boltzmann constant is $k_B$, absolute temperature is T, the permittivity of the oxide film is $\epsilon$, the film thickness of the thinner one of the oxide films sandwiching the particles with the smaller particle diameter between them is Tox [nm], and elementary charge is q.

6. The memory of claim 2, wherein the difference between the average energy $\Delta E$ and the average energy $\Delta E_1$ satisfies the following expression:

$$\Delta E - \Delta E_1 \geq 0.2 \text{ [eV/nm]} \times \text{Tox}$$

where the film thickness of the thinner one of the oxide films sandwiching the particle layer producing the $\Delta E$ between them is Tox [nm].

7. The memory of claim 2, wherein average particle diameter $d_1$ [nm] of the ones with a larger particle diameter of the first conductive particles and the second conductive particles and average particle diameter d [nm] of the others with a smaller particle diameter fulfill the following relationship:

$$d_1 \geq d / \{1 - 0.2 \text{ [eV/nm]} \times \text{Tox}(2\pi \epsilon d)/q\}$$

where Boltzmann constant is $k_B$, absolute temperature is T, the permittivity of the oxide film is $\epsilon$, the film thickness of the thinner one of the oxide films sandwiching the particles with the smaller particle diameter between them is Tox [nm], and elementary charge is q.

8. The memory of claim 1, wherein the charge storage part comprises two layers via an insulating film and enables a lower charge storage part closer to the first particle layer and an upper charge storage part closer to the second particle layer to accumulate charges independently.

9. The memory of claim 1, wherein the first particle layer comprises two layers and one layer is in contact with the channel region via an oxide film and the other layer is in contact with the charge storage part via an oxide film, and the second particle layer comprises two layers and one layer is in contact with the charge storage part via an oxide film and the other layer is in contact with the gate electrode via an oxide film.

* * * * *